United States Patent
Lin et al.

(10) Patent No.: US 10,658,195 B2
(45) Date of Patent: May 19, 2020

(54) METAL OXIDE LAYERED STRUCTURE AND METHODS OF FORMING THE SAME

(71) Applicant: Taiwan Semiconductor Manufacturing Company, Ltd., Hsinchu (TW)

(72) Inventors: Jing-Cheng Lin, Hsinchu (TW); Cheng-Lin Huang, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 16/051,273

(22) Filed: Jul. 31, 2018

(65) Prior Publication Data

US 2018/0337062 A1 Nov. 22, 2018

Related U.S. Application Data

(62) Division of application No. 14/697,380, filed on Apr. 27, 2015, now Pat. No. 10,153,175.
(Continued)

(51) Int. Cl.
*H01L 21/321* (2006.01)
*H01L 23/31* (2006.01)
(Continued)

(52) U.S. Cl.
CPC ......... *H01L 21/321* (2013.01); *H01L 21/56* (2013.01); *H01L 21/563* (2013.01);
(Continued)

(58) Field of Classification Search
CPC ............. H01L 21/321; H01L 21/76838; H01L 21/76855; H01L 21/76856
See application file for complete search history.

(56) References Cited

U.S. PATENT DOCUMENTS 4,998,157 A * 3/1991 Yokoyama ........ H01L 21/76855
257/757
5,565,378 A 10/1996 Harada et al.
(Continued)

FOREIGN PATENT DOCUMENTS

CN 101570854 A 11/2009
CN 103165477 A 6/2013
(Continued)

*Primary Examiner* — David A Zarneke
(74) *Attorney, Agent, or Firm* — Slater Matsil, LLP

(57) ABSTRACT

Some embodiment structures and methods are described. A structure includes an integrated circuit die at least laterally encapsulated by an encapsulant, and a redistribution structure on the integrated circuit die and encapsulant. The redistribution structure is electrically coupled to the integrated circuit die. The redistribution structure includes a first dielectric layer on at least the encapsulant, a metallization pattern on the first dielectric layer, a metal oxide layered structure on the metallization pattern, and a second dielectric layer on the first dielectric layer and the metallization pattern. The metal oxide layered structure includes a metal oxide layer having a ratio of metal atoms to oxygen atoms that is substantially 1:1, and a thickness of the metal oxide layered structure is at least 50 Å. The second dielectric layer is a photo-sensitive material. The metal oxide layered structure is disposed between the metallization pattern and the second dielectric layer.

8 Claims, 23 Drawing Sheets

Related U.S. Application Data

(60) Provisional application No. 62/116,170, filed on Feb. 13, 2015.

(51) Int. Cl.

| | | |
|---|---|---|
| *H01L 21/56* | (2006.01) | |
| *H01L 23/00* | (2006.01) | |
| *H01L 25/10* | (2006.01) | |
| *H01L 25/00* | (2006.01) | |
| *H01L 21/768* | (2006.01) | |
| *H01L 23/532* | (2006.01) | |
| *H01L 23/498* | (2006.01) | |
| *H01L 25/065* | (2006.01) | |
| *H01L 23/525* | (2006.01) | |

(52) U.S. Cl.
CPC .. *H01L 21/76832* (2013.01); *H01L 21/76834* (2013.01); *H01L 21/76885* (2013.01); *H01L 21/76888* (2013.01); *H01L 23/3135* (2013.01); *H01L 23/3185* (2013.01); *H01L 24/19* (2013.01); *H01L 24/20* (2013.01); *H01L 25/105* (2013.01); *H01L 25/50* (2013.01); H01L 23/49822 (2013.01); H01L 23/49894 (2013.01); H01L 23/525 (2013.01); H01L 23/5329 (2013.01); H01L 25/0657 (2013.01); H01L 2224/0401 (2013.01); H01L 2224/04105 (2013.01); H01L 2224/05008 (2013.01); H01L 2224/05548 (2013.01); H01L 2224/05569 (2013.01); H01L 2224/12105 (2013.01); H01L 2224/16227 (2013.01); H01L 2224/19 (2013.01); H01L 2224/32145 (2013.01); H01L 2224/32225 (2013.01); H01L 2224/48091 (2013.01); H01L 2224/48227 (2013.01); H01L 2224/73204 (2013.01); H01L 2224/73265 (2013.01); H01L 2224/73267 (2013.01); H01L 2224/92244 (2013.01); H01L 2225/0651 (2013.01); H01L 2225/06568 (2013.01); H01L 2225/1035 (2013.01); H01L 2225/1041 (2013.01); H01L 2225/1058 (2013.01); H01L 2924/15311 (2013.01); H01L 2924/18162 (2013.01)

(56) References Cited

U.S. PATENT DOCUMENTS

| | | | |
|---|---|---|---|
| 5,753,975 A | * | 5/1998 | Matsuno ........... H01L 21/02131 257/751 |
| 5,989,999 A | * | 11/1999 | Levine .................... C23C 16/34 257/E21.584 |
| 6,155,198 A | * | 12/2000 | Danek ..................... C23C 16/34 118/723 E |
| 7,939,421 B2 | | 5/2011 | Lin |
| 8,592,992 B2 | | 11/2013 | Lin et al. |
| 8,916,972 B2 | | 12/2014 | Lin et al. |
| 9,159,556 B2 | | 10/2015 | Johnson |
| 9,349,611 B2 | | 5/2016 | Chen et al. |
| 2005/0285230 A1 | | 12/2005 | Kim |
| 2009/0261466 A1 | | 10/2009 | Pagaila et al. |
| 2010/0308449 A1 | | 12/2010 | Yang et al. |
| 2011/0024901 A1 | | 2/2011 | Yamashita et al. |
| 2014/0252647 A1 | | 9/2014 | Huang et al. |
| 2014/0264853 A1 | | 9/2014 | Lin et al. |
| 2014/0332969 A1 | | 11/2014 | Ho et al. |
| 2015/0069631 A1 | | 3/2015 | Johnson |

FOREIGN PATENT DOCUMENTS

| | | |
|---|---|---|
| EP | 1171915 B1 | 12/2008 |
| JP | 2002321970 A | 11/2002 |
| JP | 2011049530 A | 3/2011 |
| TW | 201103103 A | 1/2011 |
| TW | 201505143 A | 2/2015 |

* cited by examiner

METAL OXIDE LAYERED STRUCTURE AND METHODS OF FORMING THE SAME

PRIORITY CLAIM AND CROSS-REFERENCE

This application is a divisional of U.S. patent application Ser. No. 14/697,380, filed on Apr. 27, 2015, entitled "Metal Oxide Layered Structure and Methods of Forming the Same," which application claims priority to and the benefit of U.S. Provisional Application No. 62/116,170, filed on Feb. 13, 2015, entitled "Metal Oxide Layered Structure and Methods of Forming the Same," which applications are hereby incorporated herein by reference in their entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
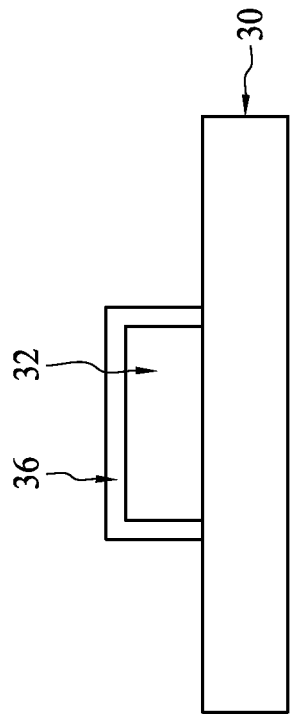
FIGS. 1 through 3 are cross sectional views of general aspects of intermediate steps during processing in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a fan-out or fan-in wafer-level package, such as used in a chip-on-package (CoP) and/or package-on-package (PoP) structure. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

Figure 2:
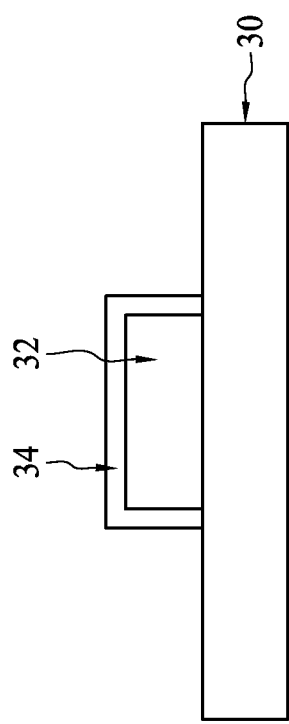
Figure 3:
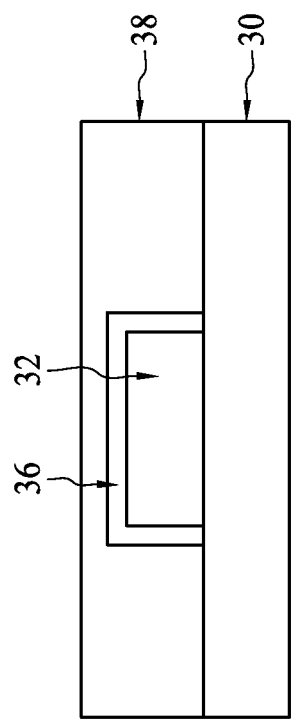

FIGS. 1 through 3 illustrate cross sectional views of general aspects of intermediate steps during processing in accordance with some embodiments. FIG. 1 illustrates a first dielectric layer 30, a metallization pattern 32 on the first dielectric layer 30, and a native oxide 34 on the metallization pattern 32. In some embodiments, the first dielectric layer 30 is formed of a polymer, which may be a photo-sensitive material such as polybenzoxazole (PBO), polyimide, benzocyclobutene (BCB), or the like. The first dielectric layer 30 may be formed by any acceptable deposition process, such as spin coating, laminating, the like, or a combination thereof, on any supporting substrate, some examples of which are described in the context of subsequent figures.

As an example to form metallization pattern 32, a seed layer (not shown) is formed on the first dielectric layer 30. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD), sputtering, or the like. A photo resist is then formed and patterned on the seed layer. The photo resist may be formed by spin coating or the like and may be exposed to light for patterning. The pattern of the photo resist corresponds to the metallization pattern 32. The patterning forms openings through the photo resist to expose the seed layer. A metal is formed in the openings of the photo resist and on the exposed portions of the seed layer. The metal may be formed by plating, such as electroplating or electroless plating, or the like. The metal may be copper, nickel, cobalt, titanium, tungsten, aluminum, or the like. Then, the photo resist and portions of the seed layer on which the metal is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and metal form the metallization pattern 32.

The native oxide 34 can be formed by the metal of the metallization pattern 32 reacting with oxygen in an ambient environment. For example, the native oxide 34 can be formed by a reaction between the metal and water, hydrogen peroxide, or the like when the metal is cleaned after an etching. Further, the native oxide 34 can be formed by a reaction between the metal and oxygen in air when the metal is exposed to air. The native oxide 34 can be formed by many ways.

In FIG. 2, a metal oxide layered structure 36 is formed on the metallization pattern 32. The metal oxide layered structure 36 can, in some embodiments, include the native oxide 34, or in other embodiment, the native oxide 34 can be removed. Examples and further details of various metal oxide layered structures 36 are illustrated and discussed with respect to FIGS. 4A-B, 5A-B, 6A-B, 7A-B, and 8A-B. The metal oxide layered structure 36 includes a layer of a metal oxide consisting essentially of atoms of a metal, such as atoms of the metal of the metallization pattern 32, and atoms of oxygen at a ratio of substantially 1:1 (solely for convenience, hereinafter such ratio is indicated as "Mx:O=1:1"). A ratio of substantially 1:1 can include ratios of 0.8:1 to 1.2:1, such as 0.9:1 to 1.1:1. For example, in some embodiments where the metallization pattern 32 is copper, the metal oxide layered structure 36 includes a layer of cupric oxide (CuO), and a ratio of copper atoms to oxygen atoms in that layer is substantially 1:1. One of ordinary skill in the art will readily understand that other incidental atoms, such as of nitrogen and/or carbon, may be included in a layer of a metal oxide consisting essentially of atoms of a metal and atoms of oxygen at a ratio of substantially 1:1 as a result of processing, for example.

In FIG. 3, a second dielectric layer 38 is formed on the metal oxide layered structure 36 and the first dielectric layer 30. In some embodiments, the second dielectric layer 38 is formed of a polymer, which may be a photo-sensitive material such as polybenzoxazole (PBO), polyimide, benzocyclobutene (BCB), or the like. As used herein, a photo-sensitive material includes a developed material that was photo-sensitive before developing. The second dielectric layer 38 may be formed by any acceptable deposition process, such as spin coating, laminating, the like, or a combination thereof.

Figure 4B:
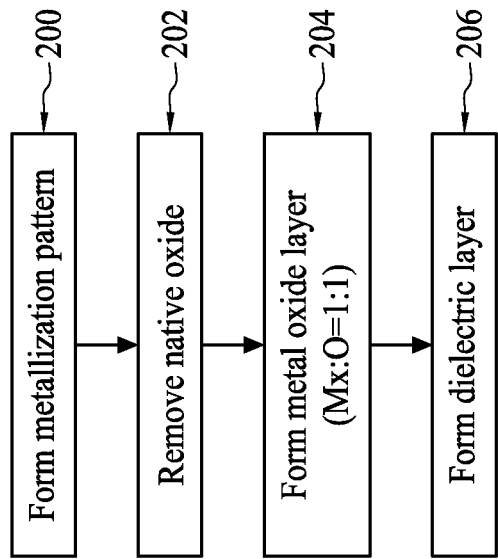
FIGS. 4A and 4B are a first example metal oxide layered structure and a method of forming the metal oxide layered structure in accordance with some embodiments.
Figure 4A:
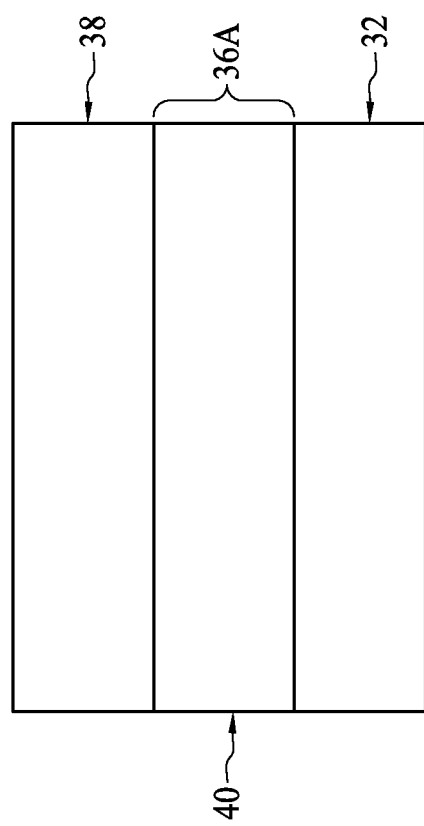

FIGS. 4A and 4B illustrate a first example metal oxide layered structure 36A and a method of forming the metal oxide layered structure 36A in accordance with some embodiments. FIG. 4A illustrates the metallization pattern 32, which in step 200 of FIG. 4B is formed as discussed with respect to FIG. 1. As discussed further in FIG. 1, a native oxide 34 may be formed on the metallization pattern 32. In step 202 of FIG. 4B, the native oxide 34 is removed. The removal may be by an acceptable cleaning process, such as a nitrogen ($N_2$) plasma process. In step 204 of FIG. 4B, a metal oxide layer 40 having Mx:O=1:1 is formed directly on the metallization pattern 32. The metal oxide layer 40 can be formed by treating the metallization pattern 32 with an oxygen-containing plasma, such as a plasma comprising oxygen ($O_2$), ozone ($O_3$), water ($H_2O$), the like, or a combination thereof. The oxygen-containing plasma can comprise additional plasma species, such as nitrogen ($N_2$), hydrogen ($H_2$), argon (Ar), the like, or a combination thereof. As an example, the metallization pattern 32 can be copper, and the metal oxide layer 40 can be cupric oxide (CuO). As illustrated, the metal oxide layered structure 36A consists of the metal oxide layer 40 having Mx:O=1:1. In step 206 of FIG. 4B, the second dielectric layer 38 is formed on the metal oxide layered structure 36A, as discussed with respect to FIG. 3.

Figure 5B:
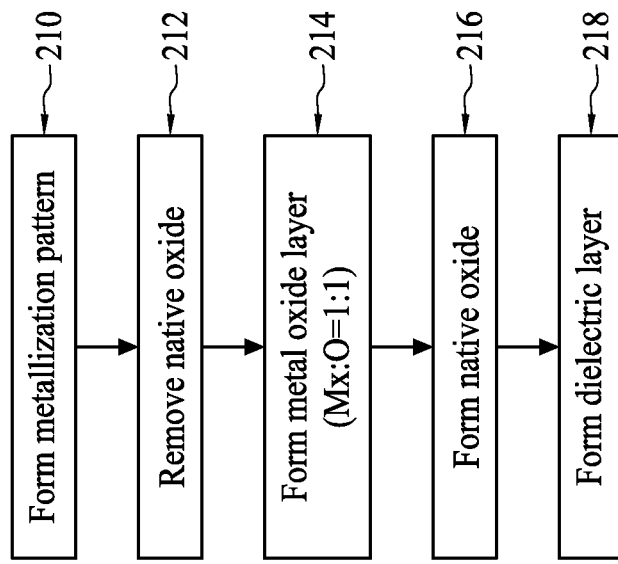
FIGS. 5A and 5B are a second example metal oxide layered structure and a method of forming the metal oxide layered structure in accordance with some embodiments.
Figure 5A:
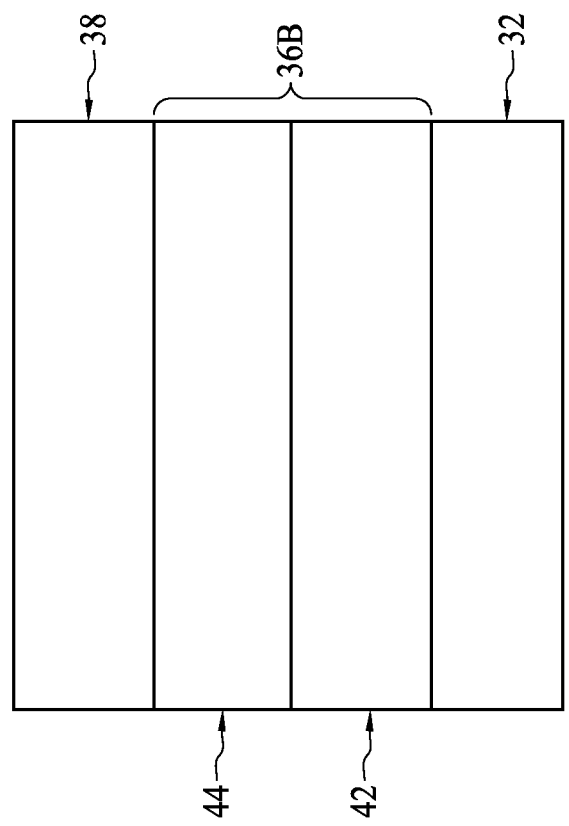

FIGS. 5A and 5B illustrate a second example metal oxide layered structure 36B and a method of forming the metal oxide layered structure 36B in accordance with some embodiments. FIG. 5A illustrates the metallization pattern 32, which in step 210 of FIG. 5B is formed as discussed with respect to FIG. 1. As discussed further in FIG. 1, a native oxide 34 may be formed on the metallization pattern 32. In step 212 of FIG. 5B, the native oxide 34 is removed. The removal may be by an acceptable cleaning process, such as a nitrogen ($N_2$) plasma process. In step 214 of FIG. 5B, a metal oxide layer 42 having Mx:O=1:1 is formed directly on the metallization pattern 32. The metal oxide layer 42 can be formed by treating the metallization pattern 32 with an oxygen-containing plasma, such as a plasma comprising oxygen ($O_2$), ozone ($O_3$), water ($H_2O$), the like, or a combination thereof. The oxygen-containing plasma can comprise additional plasma species, such as nitrogen ($N_2$), hydrogen ($H_2$), argon (Ar), the like, or a combination thereof. In step 216 of FIG. 5B, a native oxide 44 is formed on the metal oxide layer 42. The native oxide 44 may be formed by exposing the metallization pattern 32 and metal oxide layer 42 to an ambient that contains oxygen, such as during a cleaning process that uses water or by exposing the structure to air. As an example, the metallization pattern 32 can be copper; the metal oxide layer 42 can be cupric oxide (CuO); and the native oxide 44 can be cuprous oxide ($Cu_2O$). As illustrated, the metal oxide layered structure 36B consists of the metal oxide layer 42 having Mx:O=1:1 and the native oxide 44. In step 218 of FIG. 5B, the second dielectric layer 38 is formed on the metal oxide layered structure 36B, as discussed with respect to FIG. 3.

Figure 6B:
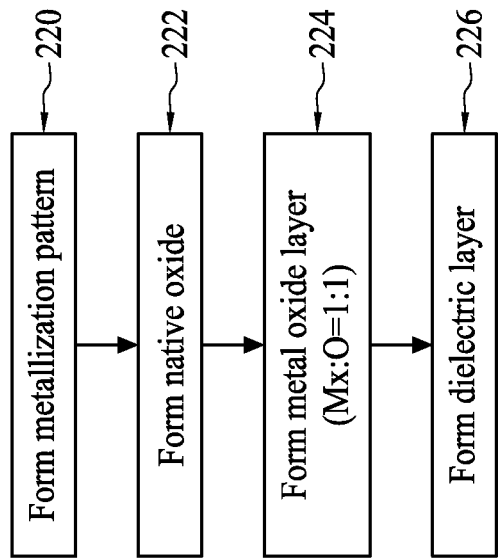
FIGS. 6A and 6B are a third example metal oxide layered structure and a method of forming the metal oxide layered structure in accordance with some embodiments.
Figure 6A:
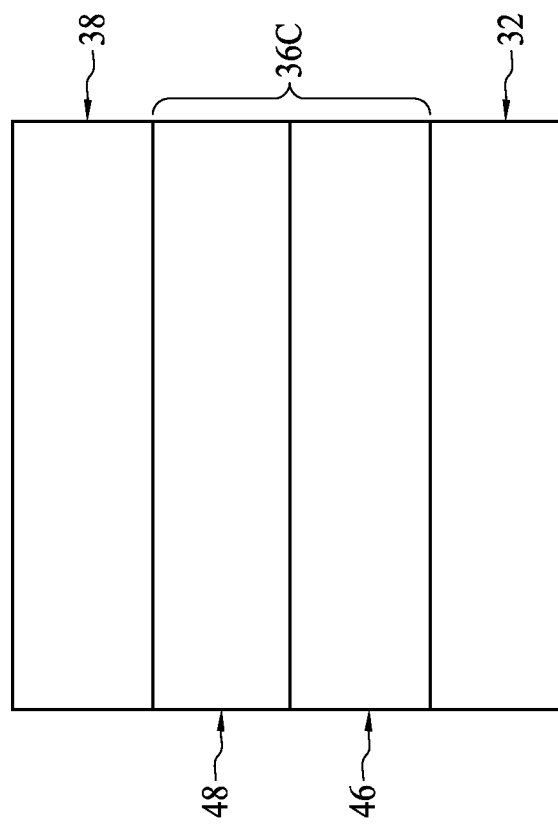

FIGS. 6A and 6B illustrate a third example metal oxide layered structure 36C and a method of forming the metal oxide layered structure 36C in accordance with some embodiments. FIG. 6A illustrates the metallization pattern 32, which in step 220 of FIG. 6B is formed as discussed with respect to FIG. 1. As discussed further in FIG. 1, and in step 222 of FIG. 6B, a native oxide 46 is formed directly on the metallization pattern 32. In step 224 of FIG. 6B, a metal oxide layer 48 having Mx:O=1:1 is formed directly on the native oxide 46. The metal oxide layer 48 can be formed by treating the native oxide 46 and metallization pattern 32 with an oxygen-containing plasma, such as a plasma comprising oxygen ($O_2$), ozone ($O_3$), water ($H_2O$), the like, or a combination thereof. The oxygen-containing plasma can comprise additional plasma species, such as nitrogen ($N_2$), hydrogen ($H_2$), argon (Ar), the like, or a combination thereof. As an example, the metallization pattern 32 can be copper; the native oxide 46 can be cuprous oxide ($Cu_2O$); and the metal oxide layer 48 can be cupric oxide (CuO). As illustrated, the metal oxide layered structure 36C consists of the native oxide 46 and the metal oxide layer 48 having Mx:O=1:1. In step 226 of FIG. 6B, the second dielectric layer 38 is formed on the metal oxide layered structure 36C, as discussed with respect to FIG. 3.

Figure 7B:
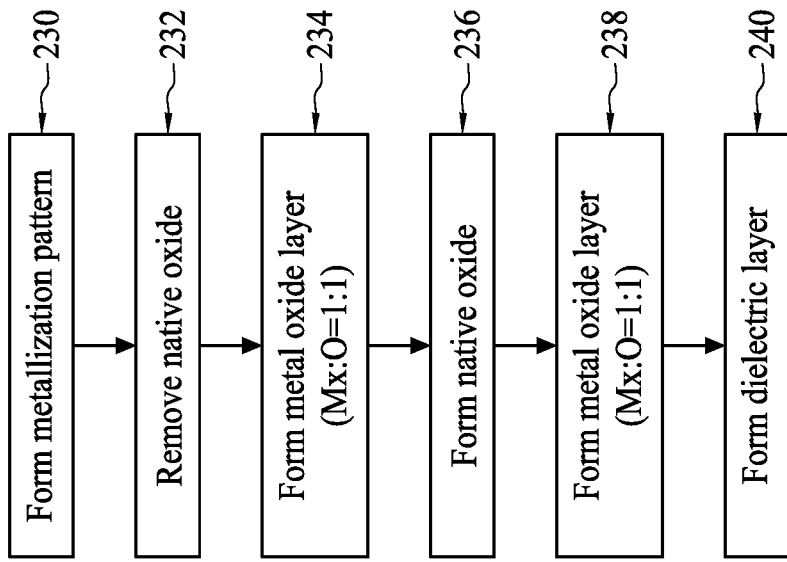
FIGS. 7A and 7B are a fourth example metal oxide layered structure and a method of forming the metal oxide layered structure in accordance with some embodiments.
Figure 7A:
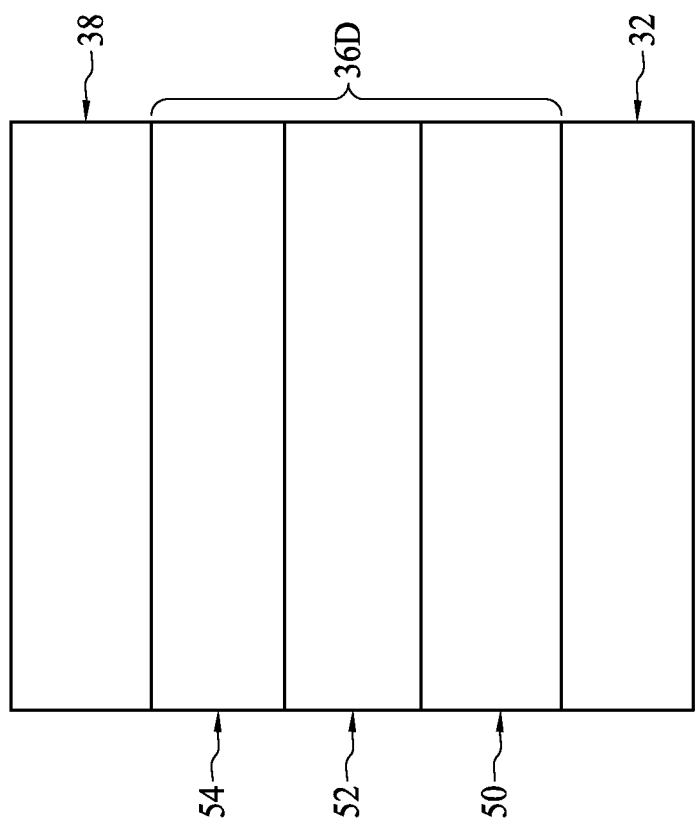

FIGS. 7A and 7B illustrate a fourth example metal oxide layered structure 36D and method of forming the metal oxide layered structure 36D in accordance with some embodiments. FIG. 7A illustrates the metallization pattern 32, which in step 230 of FIG. 7B is formed as discussed with respect to FIG. 1. As discussed further in FIG. 1, a native oxide 34 may be formed on the metallization pattern 32. In step 232 of FIG. 7B, the native oxide 34 is removed. The removal may be by an acceptable cleaning process, such as a nitrogen ($N_2$) plasma process. In step 234 of FIG. 7B, a metal oxide layer 50 having Mx:O=1:1 is formed directly on the metallization pattern 32. The metal oxide layer 50 can be formed by treating the metallization pattern 32 with an oxygen-containing plasma, such as a plasma comprising oxygen ($O_2$), ozone ($O_3$), water ($H_2O$), the like, or a combination thereof. The oxygen-containing plasma can comprise additional plasma species, such as nitrogen ($N_2$), hydrogen ($H_2$), argon (Ar), the like, or a combination thereof. In step 236 of FIG. 7B, a native oxide 52 is formed on the metal oxide layer 50. The native oxide 52 may be formed by exposing the metallization pattern 32 and metal oxide layer 50 to an ambient that contains oxygen, such as during a cleaning process that uses water or by exposing the structure to air. In step 238 of FIG. 7B, a metal oxide layer 54 having Mx:O=1:1 is formed directly on the native oxide 52. The metal oxide layer 54 can be formed by treating the native oxide 52, metal oxide layer 50, and metallization pattern 32 with an oxygen-containing plasma, such as a plasma comprising oxygen ($O_2$), ozone ($O_3$), water ($H_2O$), the like, or a combination thereof. The oxygen-containing plasma can comprise additional plasma species such as nitrogen ($N_2$), hydrogen ($H_2$), argon (Ar), the like, or a combination thereof. As an example, the metallization pattern 32 can be copper; the metal oxide layer 50 can be cupric oxide (CuO); the native oxide 52 can be cuprous oxide ($Cu_2O$); and the metal oxide layer 54 can be cupric oxide (CuO). As illustrated, the metal oxide layered structure 36D consists of the metal oxide layer 50 having Mx:O=1:1, the native oxide 52, and the metal oxide layer 54 having Mx:O=1:1. In step 240 of FIG. 7B, the second dielectric layer 38 is formed on the metal oxide layered structure 36D, as discussed with respect to FIG. 3.

Figure 8B:
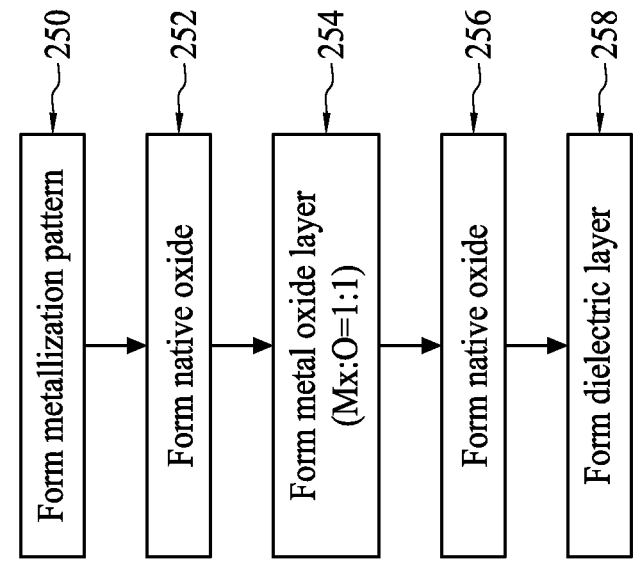
FIGS. 8A and 8B are a fifth example metal oxide layered structure and a method of forming the metal oxide layered structure in accordance with some embodiments.
Figure 8A:
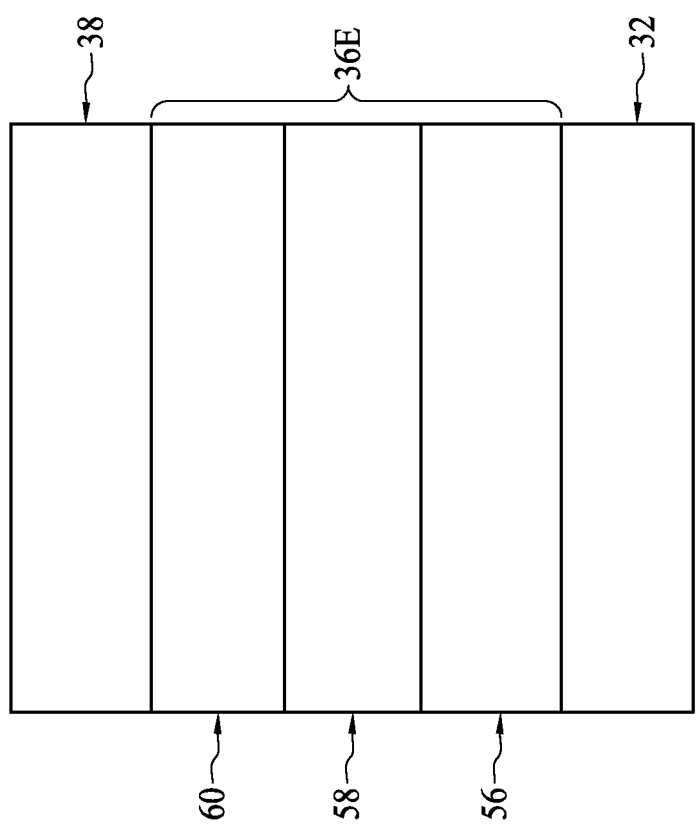

FIGS. 8A and 8B illustrate a fifth example metal oxide layered structure 36E and a method of forming the metal oxide layered structure 36E in accordance with some embodiments. FIG. 8A illustrates the metallization pattern 32, which in step 250 of FIG. 8B is formed as discussed with respect to FIG. 1. As discussed further in FIG. 1, and in step 252 of FIG. 8B, a native oxide 56 is formed directly on the metallization pattern 32. In step 254 of FIG. 8B, a metal oxide layer 58 having Mx:O=1:1 is formed directly on the native oxide 56. The metal oxide layer 58 can be formed by treating the native oxide 56 and metallization pattern 32 with an oxygen-containing plasma, such as a plasma comprising oxygen ($O_2$), ozone ($O_3$), water ($H_2O$), the like, or a combination thereof. The oxygen-containing plasma can comprise additional plasma species, such as nitrogen ($N_2$), hydrogen ($H_2$), argon (Ar), the like, or a combination thereof. In step 256 of FIG. 8B, a native oxide 60 is formed on the metal oxide layer 58. The native oxide 60 may be formed by exposing the metallization pattern 32 and metal oxide layer 58 to an ambient that contains oxygen, such as during a cleaning process that uses water or by exposing the structure to air. As an example, the metallization pattern 32 can be copper; the native oxide 56 can be cuprous oxide ($Cu_2O$); the metal oxide layer 58 can be cupric oxide (CuO); and the native oxide 60 can be cuprous oxide ($Cu_2O$). As illustrated, the metal oxide layered structure 36E consists of the native oxide 56, the metal oxide layer 58 having Mx:O=1:1, and the native oxide 60. In step 258 of FIG. 8B, the second dielectric layer 38 is formed on the metal oxide layered structure 36E, as discussed with respect to FIG. 3.

A metal oxide layered structure 36, such as metal oxide layered structures 36A, 36B, 36C, 36D, and 36E, can promote adhesion between the underlying metallization and the overlying dielectric layer, which can be a photo-sensitive material, as discussed above. Hence, the metal oxide layered structure 36 can be referred to as an adhesion structure. In some embodiments, a thickness of the metal oxide layered structure 36 is greater than or equal to about 50 Å, such as in a range from about 50 Å to about 200 Å, and more particularly in a range from about 50 Å to about 100 Å. For example, a thickness of a metal oxide layer having Mx:O=1:1 of a metal oxide layered structure 36, such as the metal oxide layer 40 of the metal oxide layered structure 36A, is greater than or equal to about 50 Å, such as in a range from about 50 Å to about 200 Å, and more particularly in a range from about 50 Å to about 100 Å. It has been found that a thickness of a metal oxide layered structure 36 greater than or equal to about 50 Å increases adhesion.

It should be noted that although specific examples have been provided using copper, cupric oxide, and cuprous oxide, other metals and oxides may be used. One of ordinary skill in the art will readily understand various oxides that may be formed when a different metal, such as nickel, cobalt, titanium, tungsten, aluminum, or the like, are used.

Figure 9:
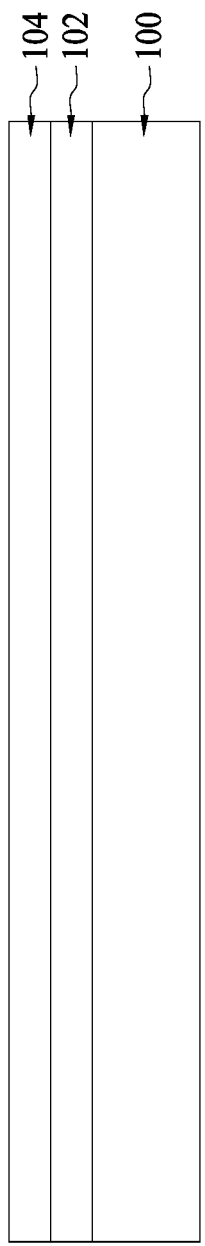
FIGS. 9 through 23 are cross sectional views of intermediate steps during a process for forming a chip-on-package (CoP) and/or a package-on-package (PoP) structure in accordance with some embodiments.

FIGS. 9 through 23 illustrate cross sectional views of intermediate steps during a process for forming a chip-on-package (CoP) and/or a package-on-package (PoP) structure in accordance with some embodiments. FIG. 9 illustrates a carrier substrate 100 and a release layer 102 formed on the carrier substrate 100. The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a Light-to-Heat-Conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of co-planarity.

Figure 10:
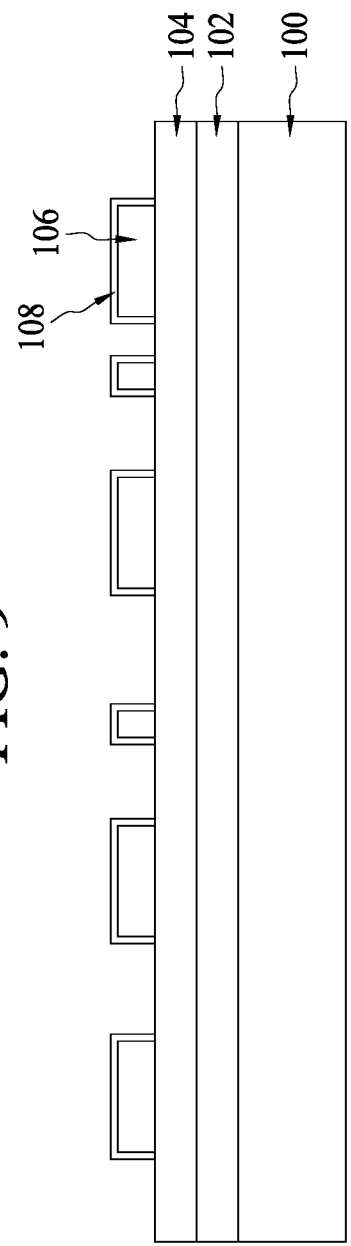
Figure 11:
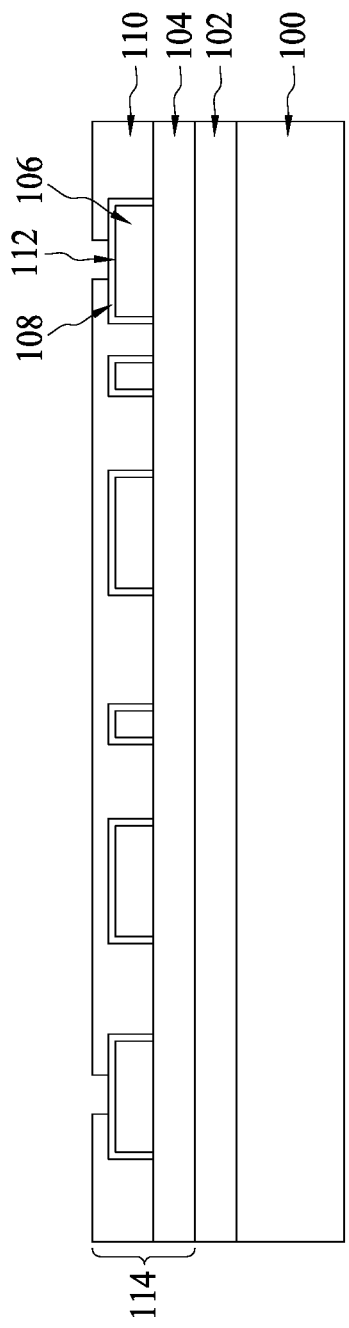

In FIGS. 9 through 11, a back side redistribution structure 114 is formed. The back side redistribution structure comprises dielectric layers 104 and 110 and a metallization pattern 106. As illustrated in FIG. 9, the dielectric layer 104 is formed on the release layer 102. The bottom surface of the dielectric layer 104 may be in contact with the top surface of the release layer 102. In some embodiments, the dielectric layer 104 is formed of a polymer, which may be a photo-sensitive material such as PBO, polyimide, BCB, or the like. The dielectric layer 104 may be formed by any acceptable deposition process, such as spin coating, laminating, the like, or a combination thereof.

In FIG. 10, the metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, sputtering, or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A metal is formed in the openings of the photo resist and on the exposed portions of the seed layer. The metal may be formed by plating, such as electroplating or electroless plating, or the like. The metal may be copper, nickel, cobalt, titanium, tungsten, aluminum, or the like. Then, the photo resist and portions of the seed layer on which the metal is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and metal form the metallization pattern 106.

A metal oxide layered structure 108 is then formed on exposed surfaces of the metallization pattern 106. The metal oxide layered structure 108 can have any of the structures illustrated in FIGS. 4A, 5A, 6A, 7A, and 8A of the like, and can be formed by any of the methods outlined in FIGS. 4B, 5B, 6B, 7B, and 8B or the like.

In FIG. 11, the dielectric layer 110 is formed on the metallization pattern 106 and the dielectric layer 104. In some embodiments, the dielectric layer 110 is formed of a polymer, which may be a photo-sensitive material such as PBO, polyimide, BCB, or the like. The dielectric layer 110 may be formed by spin coating, lamination, the like, or a combination thereof. The dielectric layer 110 is then patterned to form openings to expose portions 112 of the metal oxide layered structure 108 on the metallization pattern 106. When the dielectric layer 110 is a photo-sensitive material, the patterning may be by exposing the dielectric layer 110 to light using a lithography mask and subsequently developing the dielectric layer 110. Other patterning techniques, such as etching, can be used.

As illustrated, the back side redistribution structure 114 includes two dielectric layers 104 and 110 and one metallization pattern 106. In other embodiments, the back side redistribution structure 114 can comprise any number of dielectric layers, metallization patterns, and vias. One or more additional metallization pattern and dielectric layer may be formed in the back side redistribution structure 114 by repeating the processes for forming a metallization pattern 106 and dielectric layer 110. Vias may be formed during the formation of a metallization pattern by forming the seed layer and metal of the metallization pattern in the openings of the underlying dielectric layer. The vias may therefore interconnect and electrically couple the various metallization patterns.

Figure 12:
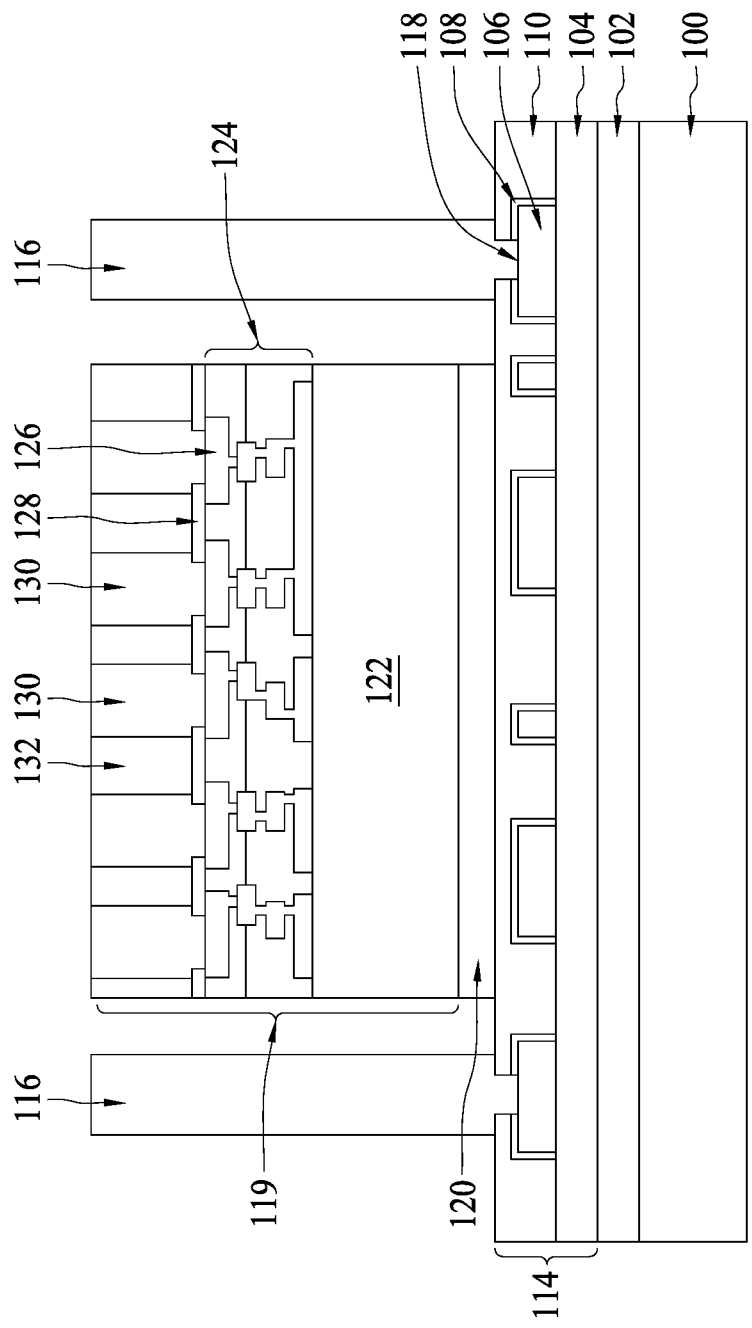

In FIG. 12, through vias 116 are formed. As an example to form the through vias 116, the exposed portions 112 of the metal oxide layered structure 108 are removed to expose portions of the metallization pattern 106, and then, a seed layer (not shown) is formed on the dielectric layer 110 and the exposed portions of the metallization pattern 106. The exposed portions 112 of the metal oxide layered structure 108 may be removed by a sputter etch or the like. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, sputtering, or the like. The exposed portions 112 of the metal oxide layered structure 108 can be removed in a same processing chamber in which the seed layer is formed. A photo resist is then formed and patterned on the seed layer. The photo resist may be formed by spin coating or the like and may be exposed to light for patterning. The pattern of the photo resist corresponds to the through vias 116. The patterning forms openings through the photo resist to expose the seed layer. A metal is formed in the openings of the photo resist and on the exposed portions of the seed layer. The metal may be formed by plating, such as electroplating or electroless plating, or the like. The metal may be copper, titanium, tungsten, aluminum, or the like. Then, the photo resist and portions of the seed layer on which the metal is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and metal form through vias 116. Because the portions 112 of the metal oxide layered structure 108 were removed from the metallization pattern 106, direct metal-metal interfaces 118 are formed between the through vias 116 and the metallization pattern 106.

Further in FIG. 12, an integrated circuit die 119 is adhered to the dielectric layer 110 by an adhesive 120. As illustrated, one integrated circuit die 119 is adhered in a package structure, and in other embodiments, more integrated circuit dies may be adhered in a package structure. Before being adhered to the dielectric layer 110, the integrated circuit die 119 may be processed according to applicable manufacturing processes to form an integrated circuit in the integrated circuit die 119. For example, the integrated circuit die 119 comprises a semiconductor substrate 122. The semiconductor substrate 122 can be a bulk semiconductor substrate, a semiconductor-on-insulator (SOI) substrate, multi-layered or gradient substrates, or the like. The semiconductor material of the semiconductor substrate 122 may be doped or undoped and may include an elemental semiconductor, such as silicon or germanium; a compound or allow semiconductor including SiGe, SiC, GaAs, GaP, InP, InAs, InSb, GaAsP, AlInAs, AlGaAs, GaInAs, GaInP, GaInAsP, or the like; or a combination thereof. Devices, such as transistors, diodes, capacitors, resistors, etc., may be formed in and/or on the semiconductor substrate 122 and may be interconnected by interconnect structures 124 formed by, for example, metallization patterns in one or more dielectric layers on the semiconductor substrate 122 to form an integrated circuit.

The integrated circuit die 119 further comprises pads 126, such as aluminum pads, to which external connections are made. The pads 126 are on what may be referred to as an active side of the integrated circuit die 119. A passivation film 128 is on the integrated circuit die 119 and on portions of the pads 126. Openings are through the passivation film 128 to the pads 126. Die connectors 130, such as conductive pillars (for example, comprising a metal such as copper), are in the openings through passivation film 128 and are mechanically and electrically coupled to the respective pads 126. The die connectors 130 may be formed by, for example, plating or the like. The die connectors 130 electrically couple the integrated circuit of the integrate circuit die 119.

A dielectric material 132 is on the active side of the integrated circuit die 119, such as on the passivation film 128 and the die connectors 130. The dielectric material 132 laterally encapsulates the die connectors 130, and the dielectric material 132 is laterally co-terminus with the integrated circuit die 119. The dielectric material 132 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 120 is on a back side of the integrated circuit die 119 and adheres the integrated circuit die 119 to the back side redistribution structure 114, such as the dielectric layer 110 in the illustration. The adhesive 120 may be any suitable adhesive, epoxy, or the like. The adhesive 120 may be applied to a back side of the integrated circuit die 119, such as to a back side of the respective semiconductor wafer. The integrated circuit die 119 may be singulated, such as by sawing or dicing, and adhered to the dielectric layer 110 by the adhesive 120 using, for example, a pick-and-place tool.

Figure 13:
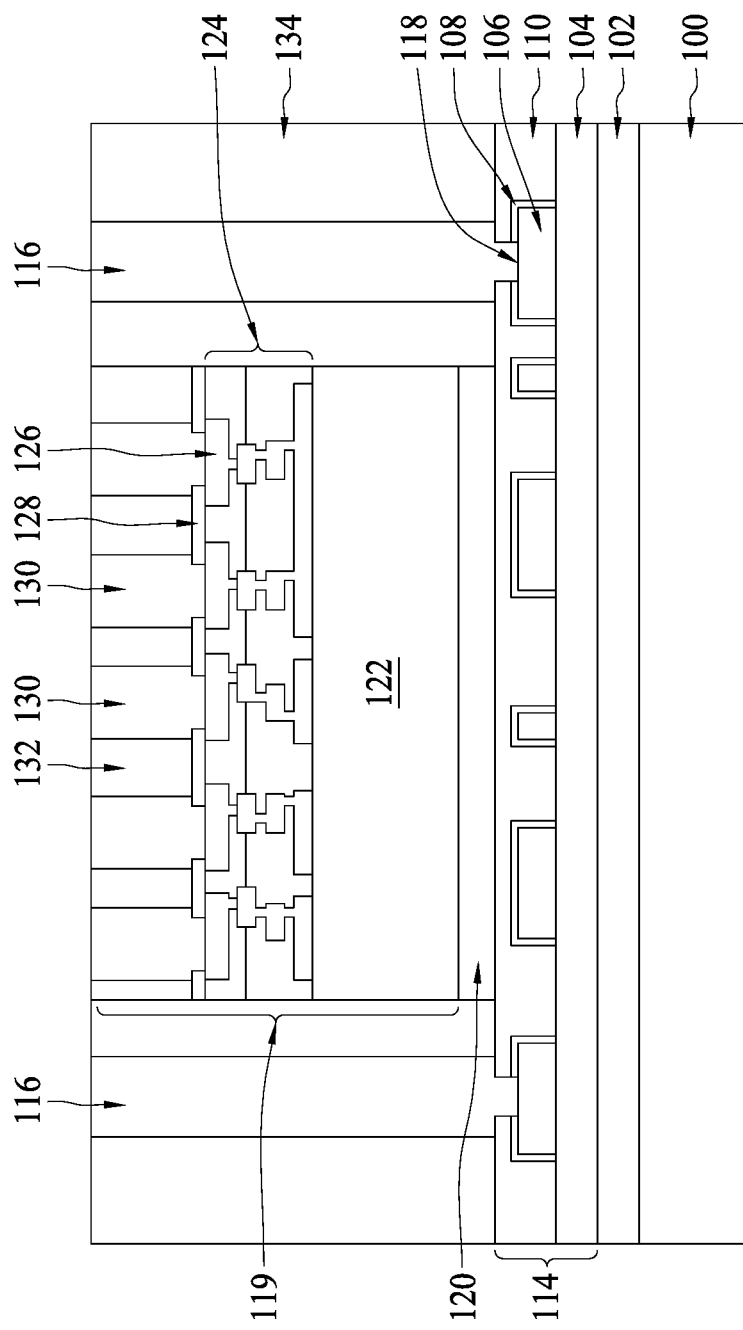

In FIG. 13, an encapsulant 134 is formed on the various components. The encapsulant 134 may be a molding compound, epoxy, or the like, and may be applied by compression molding, transfer molding, or the like. After curing, the encapsulant 134 can undergo a grinding process to expose the through vias 116 and die connectors 130. Top surfaces of the through vias 116, die connectors 130, and encapsulant 134 are co-planar after the grinding process. In some embodiments, the grinding may be omitted, for example, if through vias 116 and die connectors 130 are already exposed.

In FIGS. 14 through 20, a front side redistribution structure 166 is formed. As will be illustrated in FIG. 20, the front side redistribution structure 166 comprises dielectric layers 136, 142, 152, and 162 and metallization patterns 138, 146, and 156.

Figure 14:
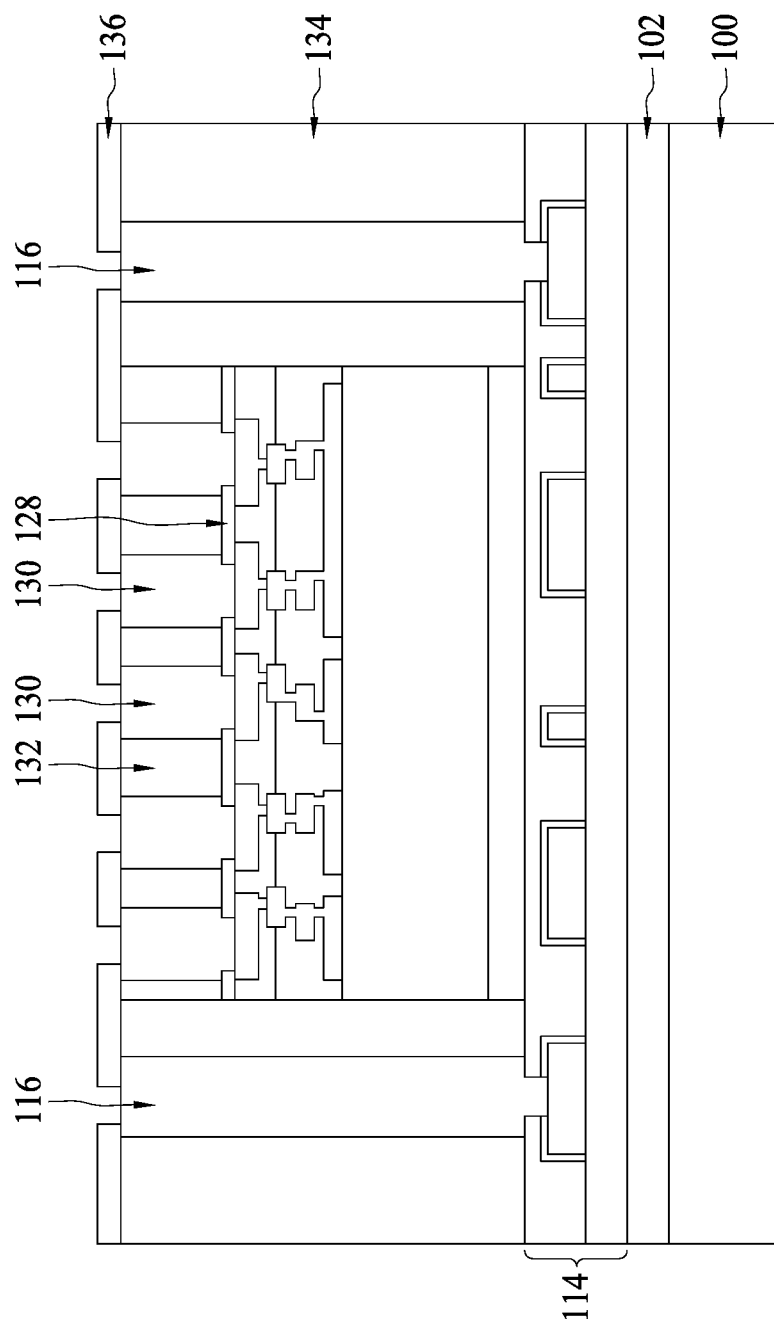

In FIG. 14, the dielectric layer 136 is formed on the encapsulant 134, through vias 116, and die connectors 130. In some embodiments, the dielectric layer 136 is formed of a polymer, which may be a photo-sensitive material such as PBO, polyimide, BCB, or the like. The dielectric layer 136 may be formed by spin coating, lamination, the like, or a combination thereof. The dielectric layer 136 is then patterned to form openings to expose portions of the through vias 116 and die connectors 130. When the dielectric layer 136 is a photo-sensitive material, the patterning may be by exposing the dielectric layer 136 to light using a lithography mask and subsequently developing the dielectric layer 136. Other patterning techniques, such as etching, can be used.

Figure 15:
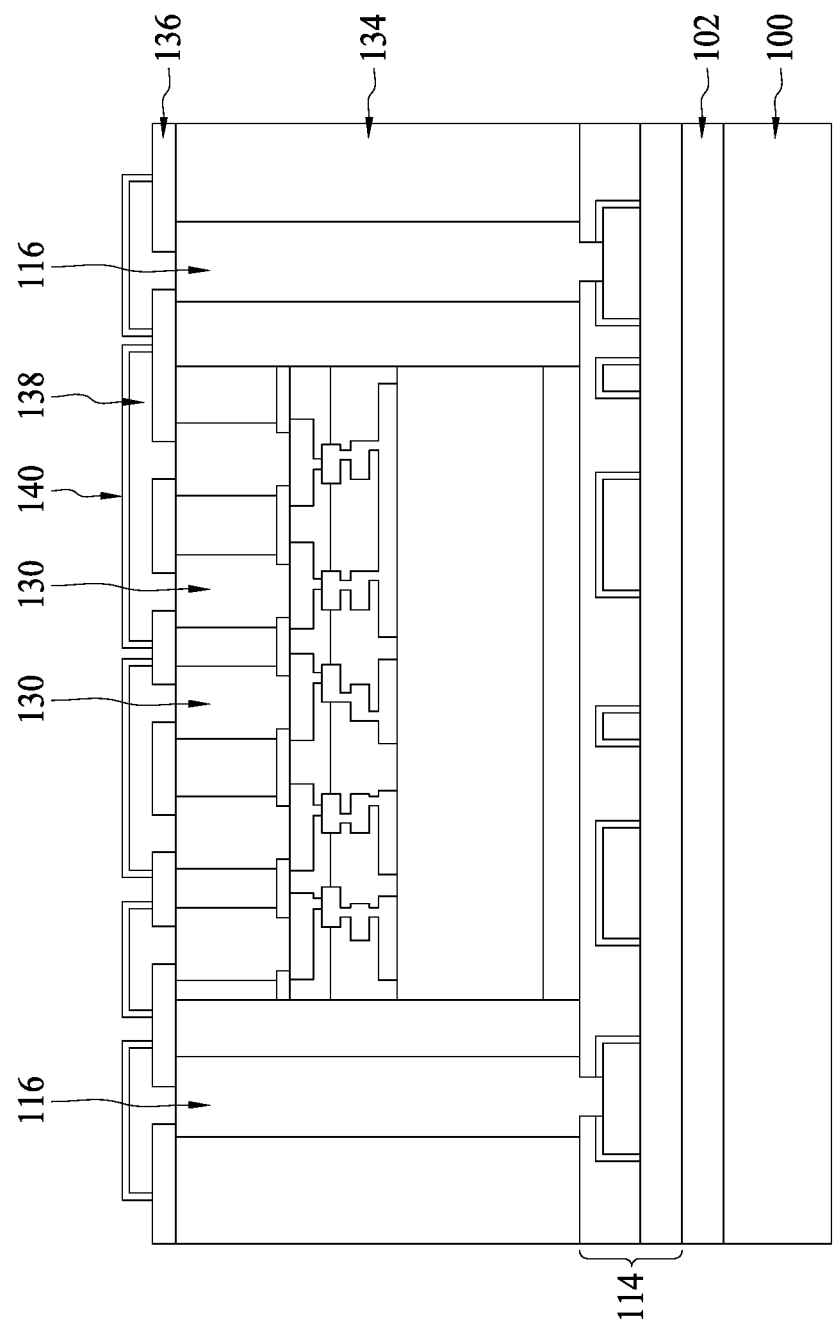

In FIG. 15, metallization pattern 138 with vias is formed on the dielectric layer 136. As an example to form metallization pattern 138, a seed layer (not shown) is formed over the dielectric layer 136 and in openings through the dielectric layer 136. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A metal is formed in the openings of the photo resist and on the exposed portions of the seed layer. The metal may be formed by plating, such as electroplating or electroless plating, or the like. The metal may comprise a metal, like copper, nickel, cobalt, titanium, tungsten, aluminum, or the like. Then, the photo resist and portions of the seed layer on which the metal is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and metal form the metallization pattern 138 and vias. The vias are formed in openings through the dielectric layer 136 to, e.g., the through vias 116 and/or the die connectors 130.

A metal oxide layered structure 140 is then formed on exposed surfaces of the metallization pattern 138. The metal oxide layered structure 140 can have any of the structures illustrated in FIGS. 4A, 5A, 6A, 7A, and 8A or the like, and can be formed by any of the methods outlined in FIGS. 4B, 5B, 6B, 7B, and 8B or the like.

Figure 16:
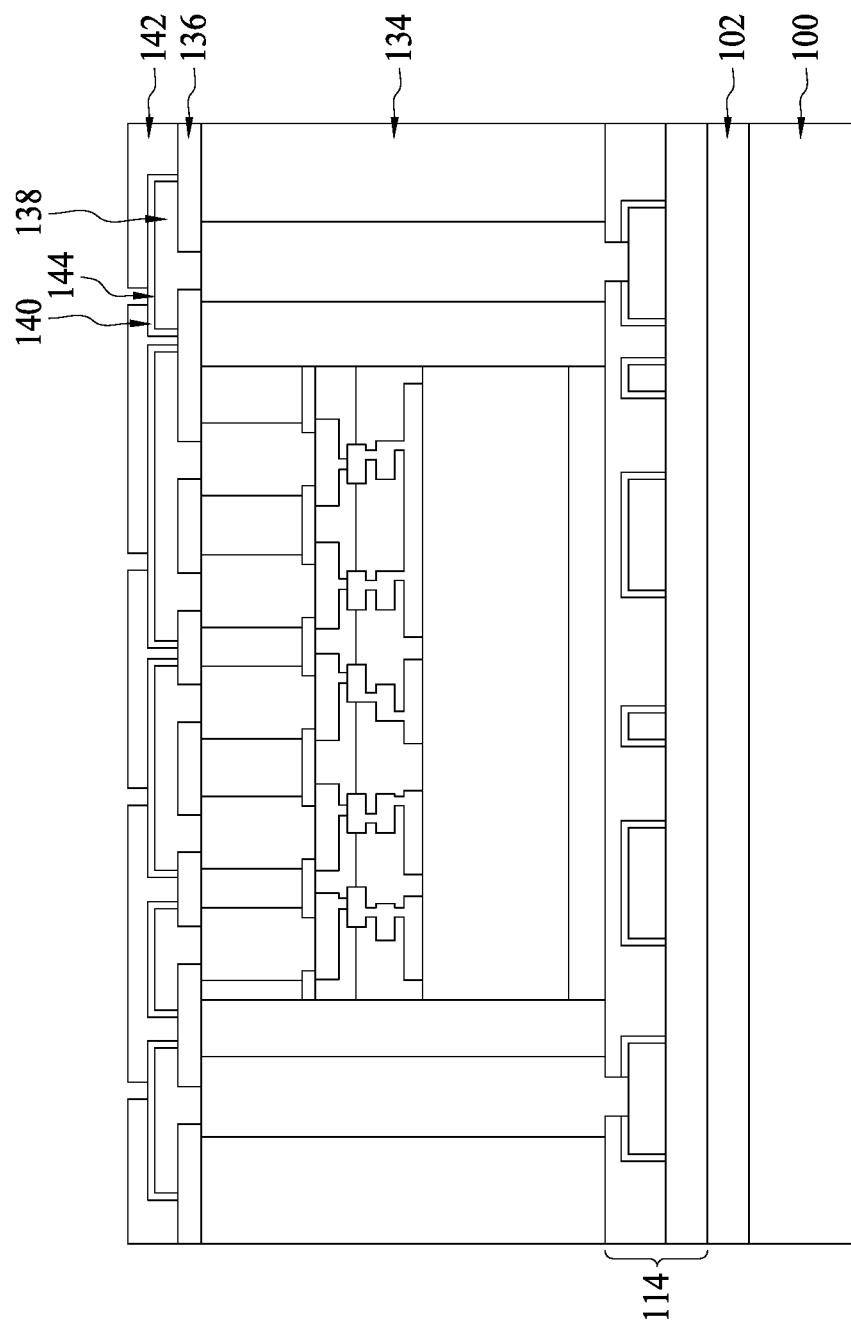

In FIG. 16, the dielectric layer 142 is formed on the metallization pattern 138 and the dielectric layer 136. In some embodiments, the dielectric layer 142 is formed of a polymer, which may be a photo-sensitive material such as PBO, polyimide, BCB, or the like. The dielectric layer 142 may be formed by spin coating, lamination, the like, or a combination thereof. The dielectric layer 142 is then patterned to form openings to expose portions 144 of the metal oxide layered structure 140 on the metallization pattern 138. When the dielectric layer 142 is a photo-sensitive material, the patterning may be by exposing the dielectric layer 142 to light using a lithography mask and subsequently developing the dielectric layer 142. Other patterning techniques, such as etching, can be used.

Figure 17:
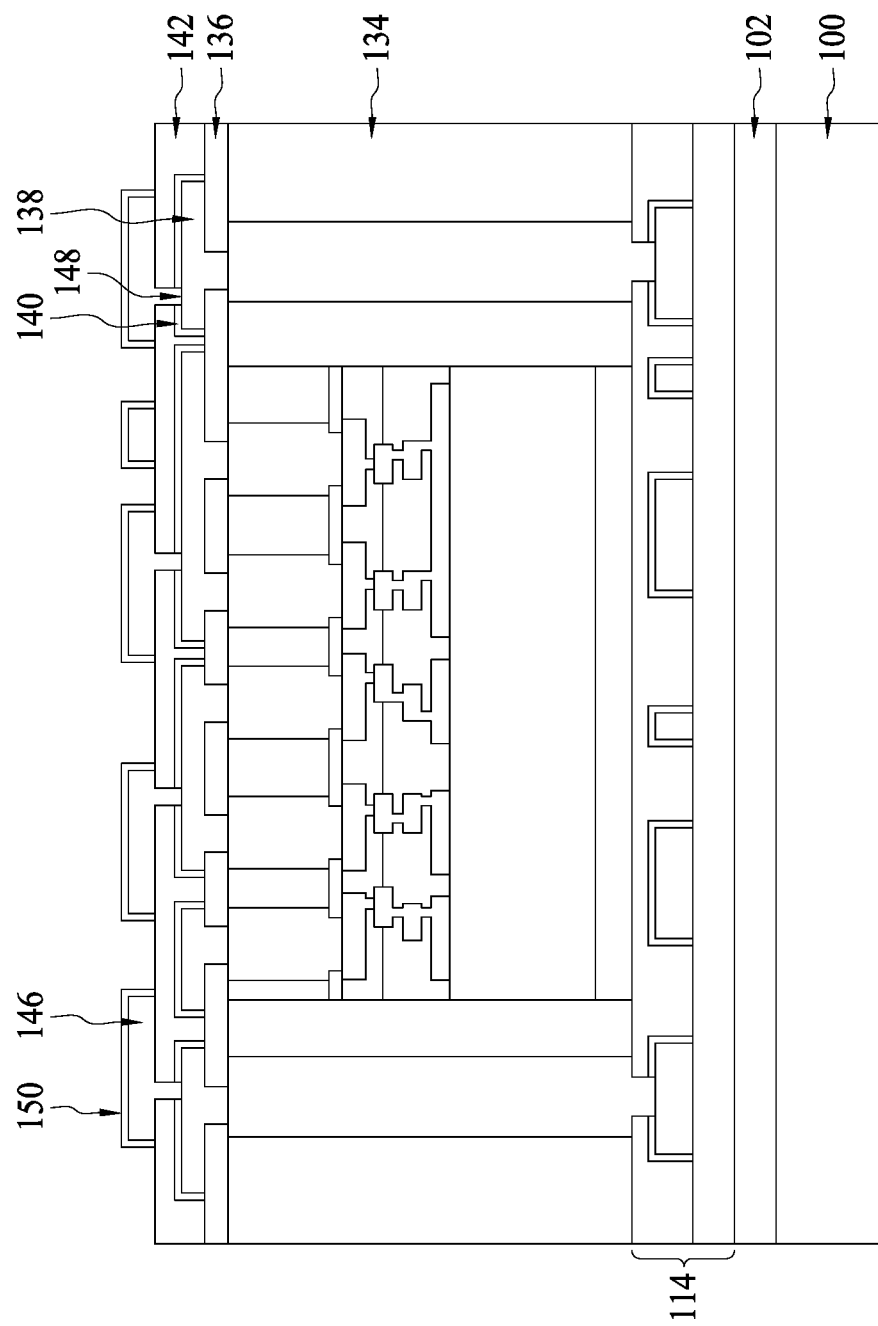

In FIG. 17, metallization pattern 146 with vias is formed on the dielectric layer 142. As an example to form metallization pattern 146, the exposed portions 144 of the metal oxide layered structure 140 are removed to expose portions of the metallization pattern 138, and then, a seed layer (not shown) is formed on the dielectric layer 142 and the exposed portions of the metallization pattern 138. The exposed portions 144 of the metal oxide layered structure 140 may be removed by a sputter etch or the like. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, sputtering, or the like. The exposed portions 144 of the metal oxide layered structure 140 can be removed in a same processing chamber in which the seed layer is formed. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A metal is formed in the openings of the photo resist and on the exposed portions of the seed layer. The metal may be formed by plating, such as electroplating or electroless plating, or the like. The metal may be copper, nickel, cobalt, titanium, tungsten, aluminum, or the like. Then, the photo resist and portions of the seed layer on which the metal is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and metal form the metallization pattern 146 and vias. The vias are formed in openings through the dielectric layer 142 to, e.g., portions of the metallization pattern 138. Because the portions 144 of the metal oxide layered structure 140 were removed from the metallization pattern 138, direct metal-metal interfaces 148 are formed between the vias of the metallization pattern 146 and the metallization pattern 138.

A metal oxide layered structure 150 is then formed on exposed surfaces of the metallization pattern 146. The metal oxide layered structure 150 can have any of the structures illustrated in FIGS. 4A, 5A, 6A, 7A, and 8A or the like, and can be formed by any of the methods outlined in FIGS. 4B, 5B, 6B, 7B, and 8B or the like.

Figure 18:
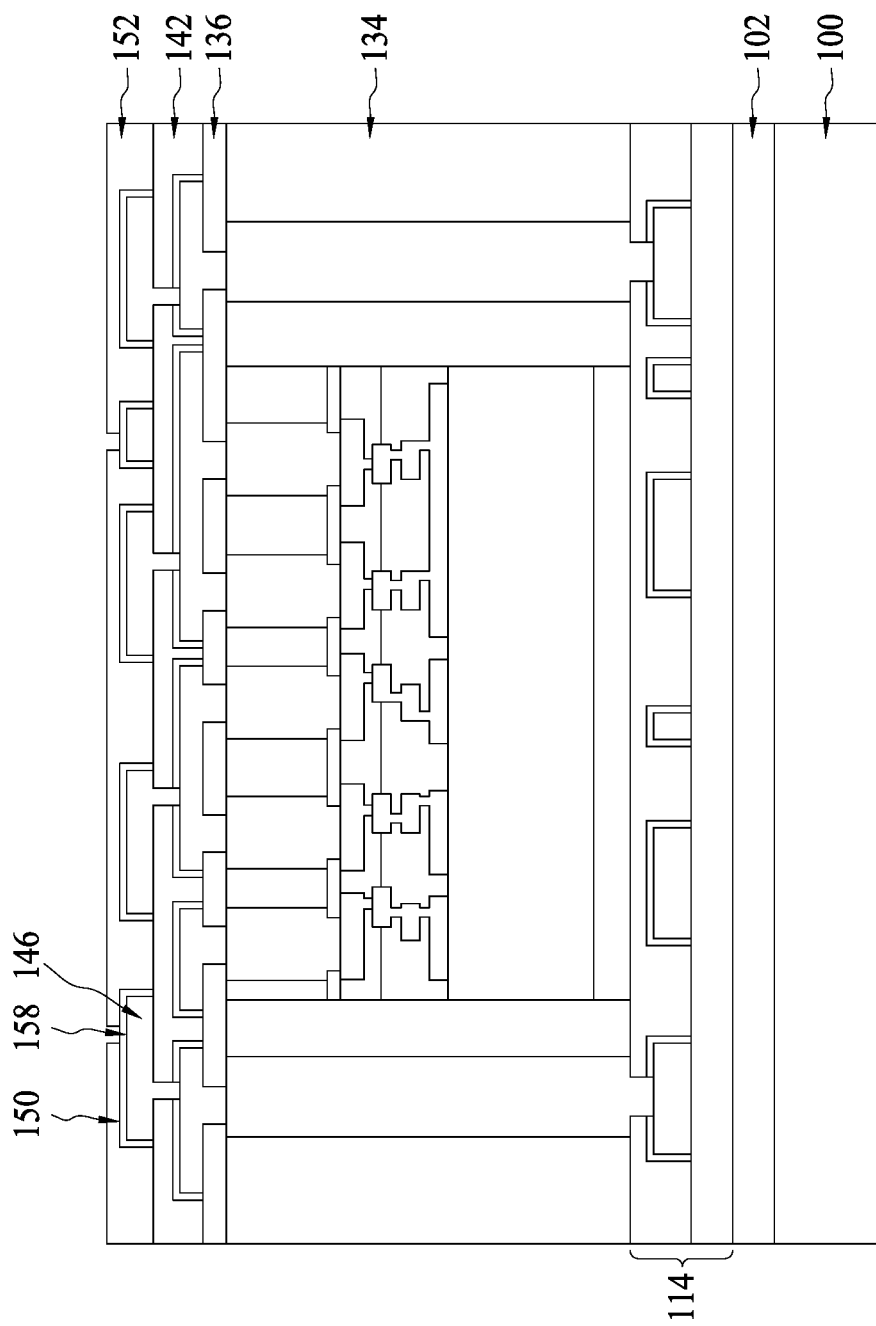

In FIG. 18, the dielectric layer 152 is formed on the metallization pattern 146 and the dielectric layer 142. In some embodiments, the dielectric layer 152 is formed of a polymer, which may be a photo-sensitive material such as PBO, polyimide, BCB, or the like. The dielectric layer 152 may be formed by spin coating, lamination, the like, or a combination thereof. The dielectric layer 152 is then patterned to form openings to expose portions 154 of the metal oxide layered structure 150 on the metallization pattern 146. When the dielectric layer 152 is a photo-sensitive material, the patterning may be by exposing the dielectric layer 152 to light using a lithography mask and subsequently developing the dielectric layer 152. Other patterning techniques, such as etching, can be used.

Figure 19:
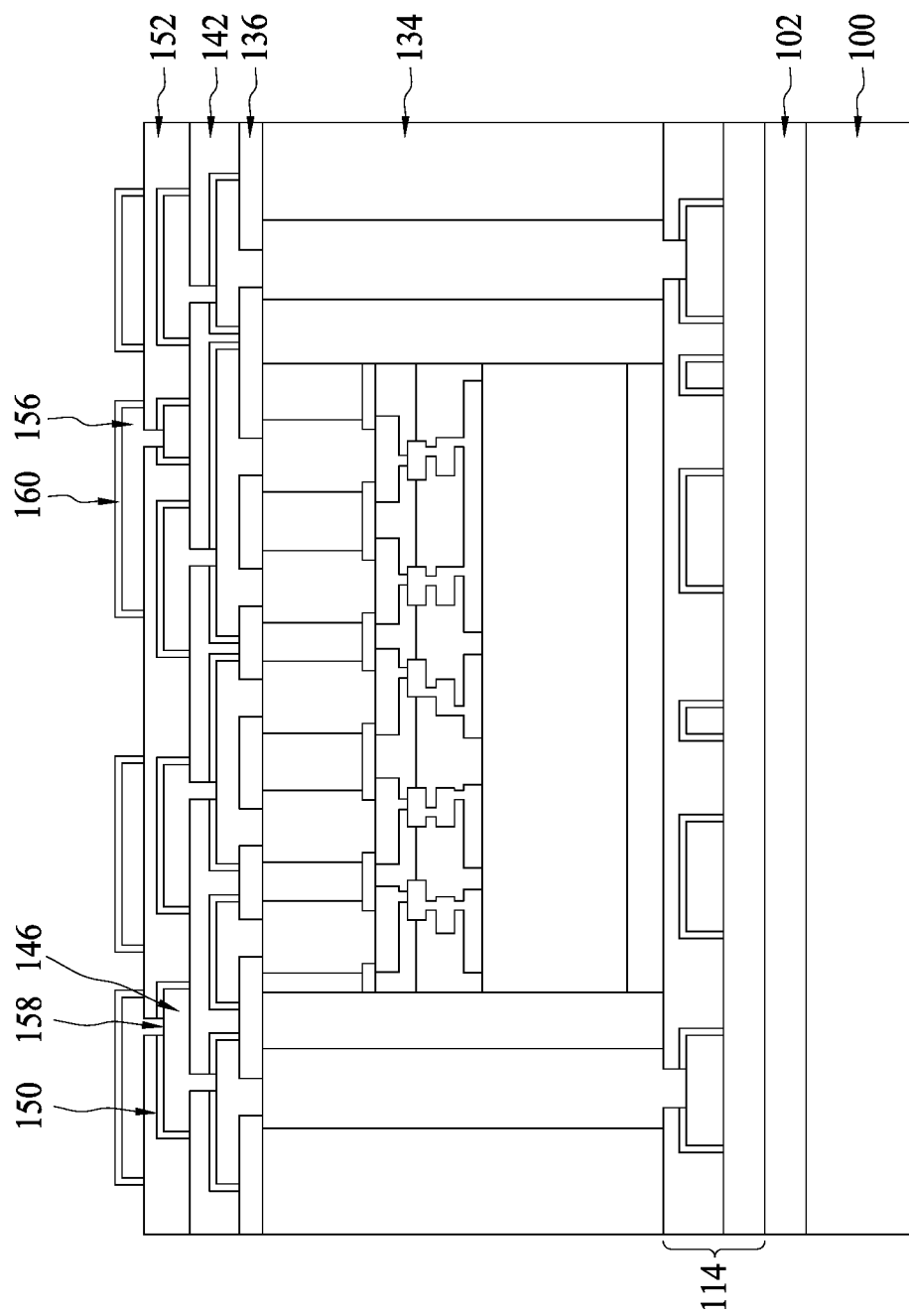

In FIG. 19, metallization pattern 156 with vias is formed on the dielectric layer 152. As an example to form metallization pattern 156, the exposed portions 154 of the metal oxide layered structure 150 are removed to expose portions of the metallization pattern 146, and then, a seed layer (not shown) is formed on the dielectric layer 152 and the exposed portions of the metallization pattern 146. The exposed portions 154 of the metal oxide layered structure 150 may be removed by a sputter etch or the like. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, sputtering, or the like. The exposed portions 154 of the metal oxide layered structure 150 can be removed in a same processing chamber in which the seed layer is formed. A photo resist is then formed and patterned on the seed layer. The photo resist may be formed by spin coating or the like and may be exposed to light for patterning. The pattern of the photo resist corresponds to the metallization pattern 156. The patterning forms openings through the photo resist to expose the seed layer. A metal is formed in the openings of the photo resist and on the exposed portions of the seed layer. The metal may be formed by plating, such as electroplating or electroless plating, or the like. The metal may be copper, nickel, cobalt, titanium, tungsten, aluminum, or the like. Then, the photo resist and portions of the seed layer on which the metal is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and metal form the metallization pattern 156 and vias. The vias are formed in openings through the dielectric layer 152 to, e.g., portions of the metallization pattern 146. Because the portions 154 of the metal oxide layered structure 150 were removed from the metallization pattern 146, direct metal-metal interfaces 158 are formed between the vias of the metallization pattern 156 and the metallization pattern 146.

A metal oxide layered structure 160 is then formed on exposed surfaces of the metallization pattern 156. The metal oxide layered structure 160 can have any of the structures illustrated in FIGS. 4A, 5A, 6A, 7A, and 8A or the like, and can be formed by any of the methods outlined in FIGS. 4B, 5B, 6B, 7B, and 8B or the like.

Figure 20:
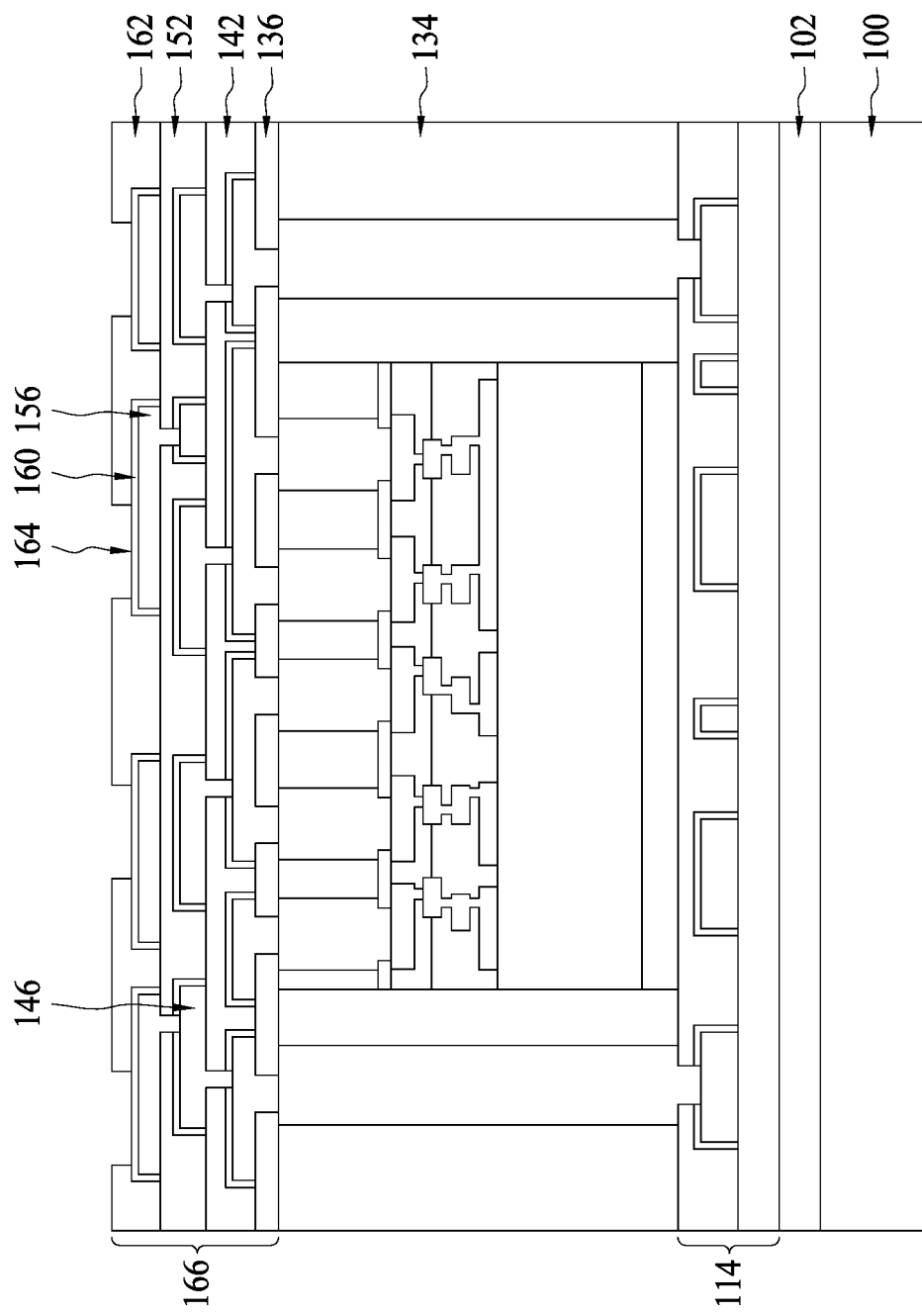

In FIG. 20, the dielectric layer 162 is formed on the metallization pattern 156 and the dielectric layer 152. In some embodiments, the dielectric layer 162 is formed of a polymer, which may be a photo-sensitive material such as PBO, polyimide, BCB, or the like. The dielectric layer 162 may be formed by spin coating, lamination, the like, or a combination thereof. The dielectric layer 162 is then patterned to form openings to expose portions 164 of the metal oxide layered structure 160 on the metallization pattern 156. When the dielectric layer 162 is a photo-sensitive material, the patterning may be by exposing the dielectric layer 162 to light using a lithography mask and subsequently developing the dielectric layer 162. Other patterning techniques, such as etching, can be used.

The front side redistribution structure 166 is shown as an example. More or fewer dielectric layers and metallization patterns may be formed in the front side redistribution structure 166. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 21:
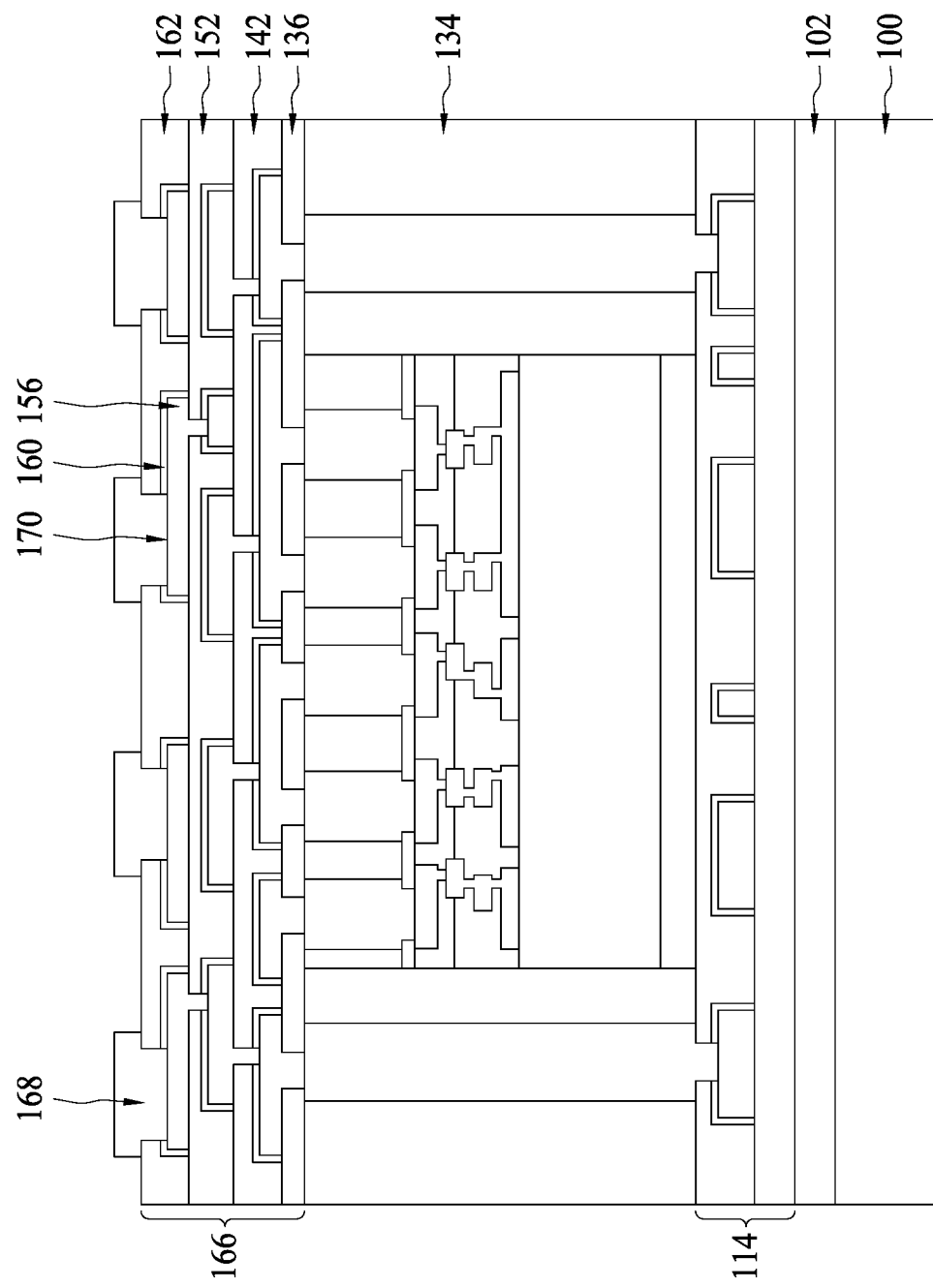

In FIG. 21, pads 168, which may be referred to as Under Bump Metallurgies (UBMs), are formed on an exterior side of the front side redistribution structure 166. In the illustrated embodiment, pads 168 are formed through openings through the dielectric layer 162 to the metallization pattern 156. As an example to form the pads 168, the exposed portions 164 of the metal oxide layered structure 160 are removed to expose portions of the metallization pattern 156, and then, a seed layer (not shown) is formed on the dielectric layer 162 and the exposed portions of the metallization pattern 156. The exposed portions 164 of the metal oxide layered structure 160 may be removed by a sputter etch or the like. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, sputtering, or the like. The exposed portions 164 of the metal oxide layered structure 160 can be removed in a same processing chamber in which the seed layer is formed. A photo resist is then formed and patterned on the seed layer. The photo resist may be formed by spin coating or the like and may be exposed to light for patterning. The pattern of the photo resist corresponds to the pads 168. The patterning forms openings through the photo resist to expose the seed layer. A metal is formed in the openings of the photo resist and on the exposed portions of the seed layer. The metal may be formed by plating, such as electroplating or electroless plating, or the like. The metal may be copper, titanium, tungsten, aluminum, or the like. Then, the photo resist and portions of the seed layer on which the metal is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and metal form the pads 168. The pads 168 are formed in openings through the dielectric layer 162 to, e.g., portions of the metallization pattern 156. Because the portions 164 of the metal oxide layered structure 160 were removed from the metallization pattern 156, direct metal-metal interfaces 170 are formed between the pads 168 and the metallization pattern 156.

Figure 22:
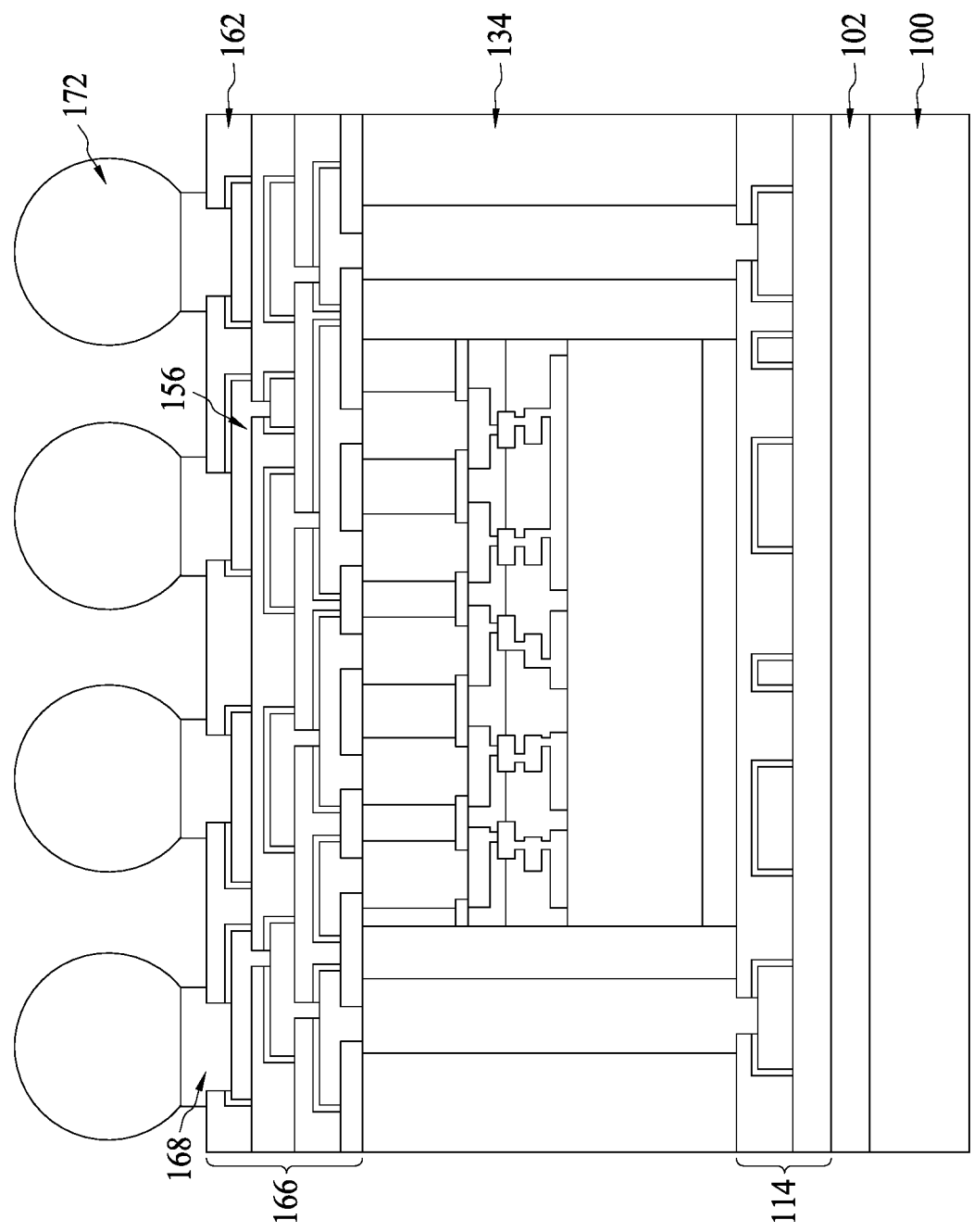

In FIG. 22, external electrical connectors 172, such as solder balls, like ball grid array (BGA) balls, are formed on the pads 168. The external electrical connectors 172 may include a low-temperature reflowable material such as solder, which may be lead-free or lead-containing. The external electrical connectors 172 may be formed by using an appropriate ball drop process. In some embodiments, the pads 168 can be omitted, and the external electrical connectors 172 can be formed directly on the metallization pattern 156 through the openings through the dielectric layer 162.

Figure 23:
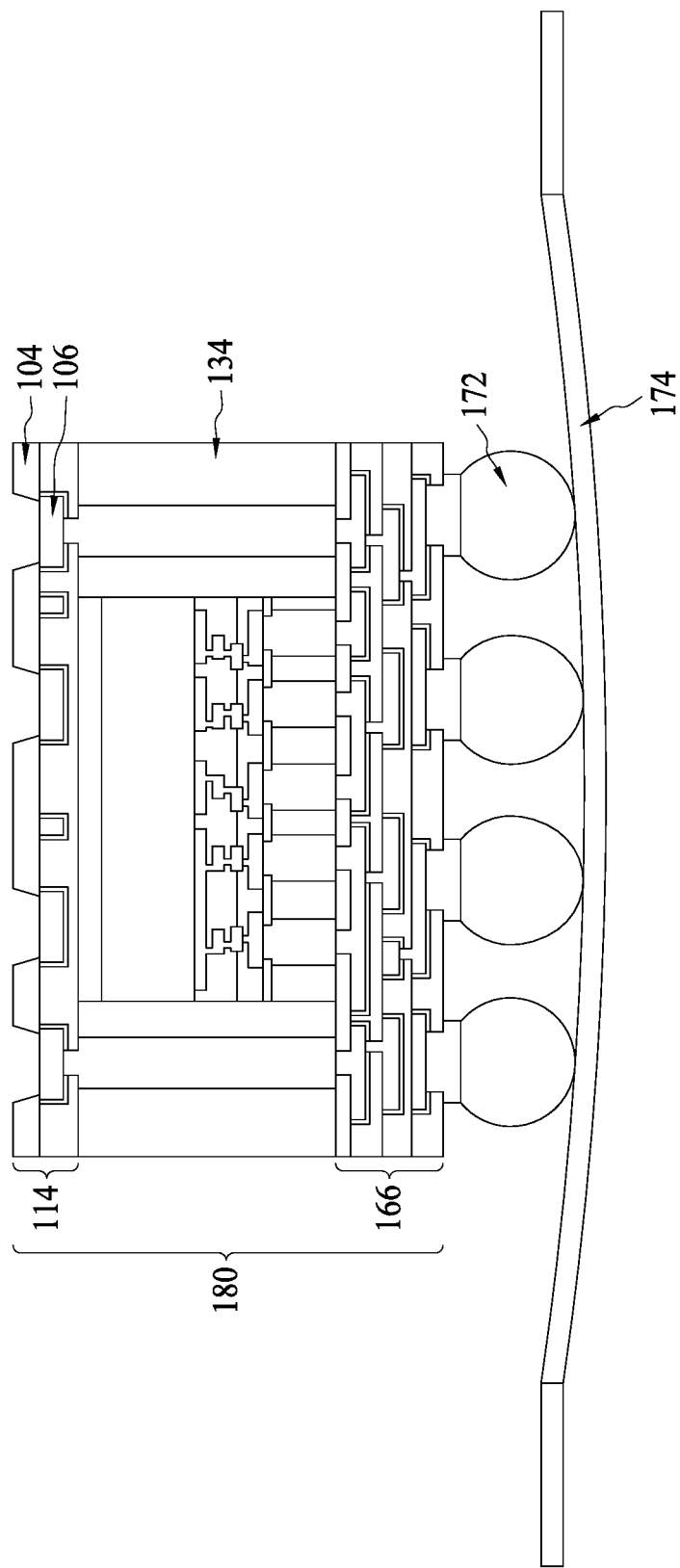

In FIG. 23, a carrier substrate de-bonding is performed to detach (de-bond) the carrier substrate 100 from the back side redistribution structure 114, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 174. Openings are formed through the dielectric layer 104 to expose portions of the metallization pattern 106. The openings may be formed, for example, using laser drilling, etching, or the like.

Although not specifically illustrated, one of ordinary skill in the art will readily understand that typically the structures formed in FIGS. 9 through 23 are also simultaneously formed in other regions of the carrier substrate 100, which may be a wafer. Accordingly, a singulation process is performed, such as by sawing, to singulate a single package 180 from other packages that may have been formed simultaneously with the package 180.

As illustrated in FIGS. 24 through 27, the package 180 can be incorporated into a variety of chip-on-package (CoP) and package-on-package (PoP) structures. FIGS. 24 through 27 are example structures, and the package 180 can be incorporated in any package structure. In FIGS. 24 through 27, the package 180 is attached to a substrate 182. The external electrical connectors 172 are electrically and mechanically coupled to pads 184 on the substrate 182. The substrate 182 can be, for example, a printed circuit board (PCB) or the like.

Figure 24:
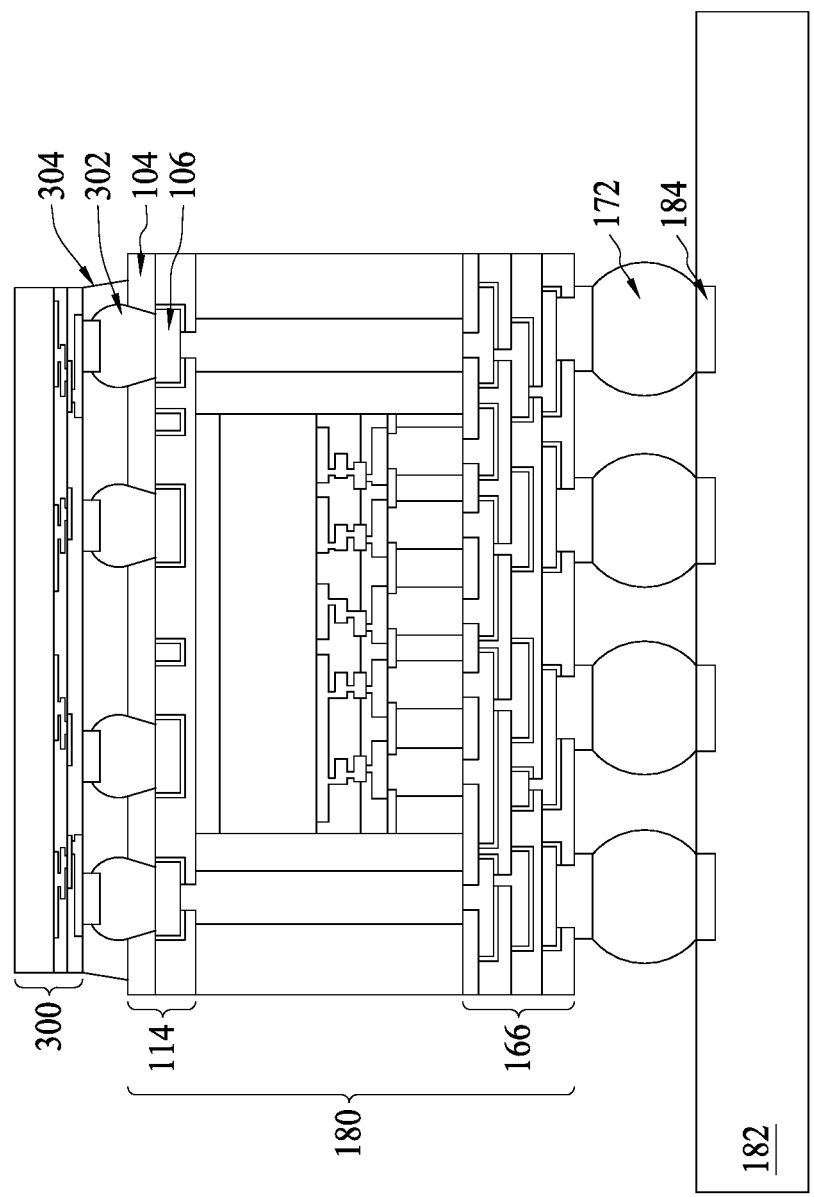
FIG. 24 is a CoP structure in accordance with some embodiments.

In FIG. 24, an integrated circuit die 300 (or chip) is attached to the back side redistribution structure 114 of the package 180 by external electrical connectors 302. The integrated circuit die 300 can be any integrated circuit die, such as a logic die, analog die, memory die, or the like. The integrated circuit die 300 is electrically and mechanically coupled to the back side redistribution structure 114 by external electrical connectors 302 attached to the metallization pattern 106 through openings through the dielectric layer 104. The external electrical connectors 302 can include low-temperature reflowable material, such as solder, such as a lead-free solder, and in additional embodiments, the external electrical connectors 302 can include metal pillars. In some embodiments, the external electrical connectors 302 are controlled collapse chip connection (C4) bumps, microbumps, or the like. In some embodiments, the external electrical connectors 302 can be reflowed to attach the integrated circuit die 300 to the package 180. An underfill material 304 can also be dispensed between the integrated circuit die 300 and the backside redistribution structure 114 of the package 180 and around the external electrical connectors 302.

Figure 25:
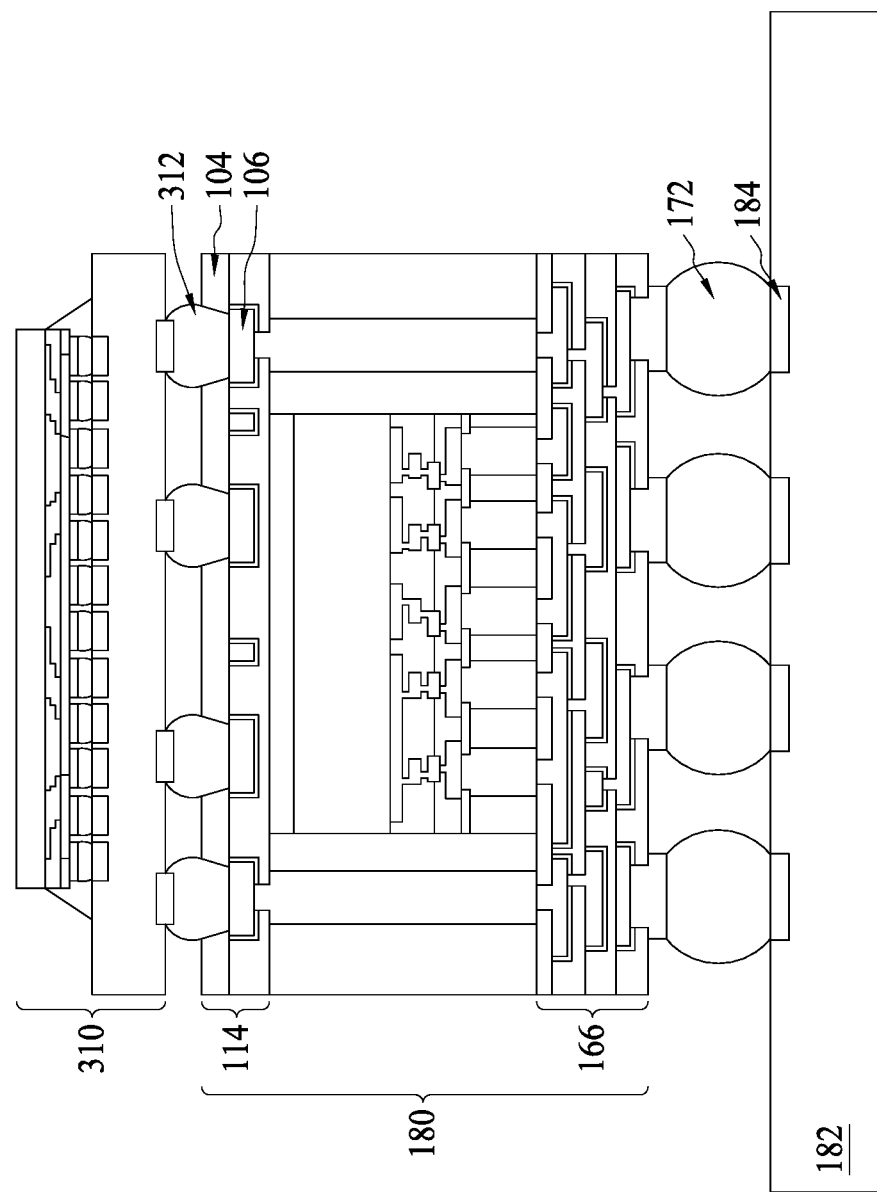
FIG. 25 is a first PoP structure in accordance with some embodiments.

In FIG. 25, a package component 310 is attached to the back side redistribution structure 114 of the package 180 by external electrical connectors 312. The package component 310 in this example includes an integrated circuit die flip-chip attached to an interposer. The integrated circuit die can be any integrated circuit die, such as a logic die, analog die, memory die, or the like. The package component 310 is electrically and mechanically coupled to the back side redistribution structure 114 by external electrical connectors 312 attached to the metallization pattern 106 through openings through the dielectric layer 104. The external electrical connectors 312 can include low-temperature reflowable material, such as solder, such as a lead-free solder, and in additional embodiments, the external electrical connectors 312 can include metal pillars. In some embodiments, the external electrical connectors 312 are C4 bumps, microbumps, or the like. In some embodiments, the external electrical connectors 312 can be reflowed to attach the package component 310 to the package 180.

Figure 26:
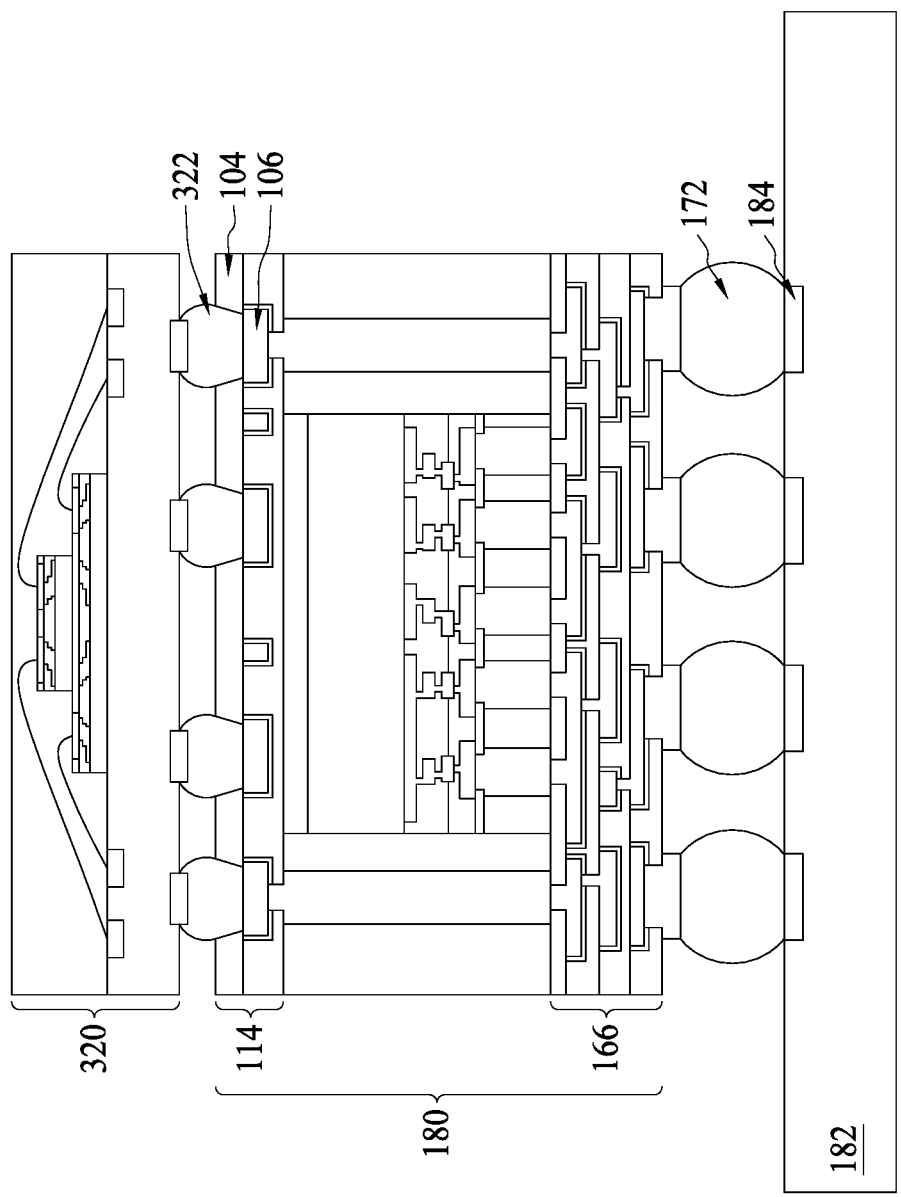
FIG. 26 is a second PoP structure in accordance with some embodiments.

In FIG. 26, a package 320 is attached to the back side redistribution structure 114 of the package 180 by external electrical connectors 322. The package 320 comprises a substrate, two stacked integrated circuit dies on the substrate, wire bonds electrically coupling the integrated circuit dies to the substrate, and an encapsulant encapsulating the stacked integrated circuit dies and the wire bonds. In an example, the integrated circuit dies of the package 320 are memory dies, such as dynamic random access memory (DRAM) dies. The package 320 is electrically and mechanically coupled to the back side redistribution structure 114 by external electrical connectors 322 attached to the metallization pattern 106 through openings through the dielectric layer 104. In some embodiments, the external electrical connectors 322 can include low-temperature reflowable material, such as solder, such as a lead-free solder, and in additional embodiments, the external electrical connectors 322 can include metal pillars. In some embodiments, the external electrical connectors 322 are C4 bumps, microbumps, or the like. In some embodiments, the external electrical connectors 322 can be reflowed to attach the package 320 to the metallization pattern 106. The integrated circuit dies of the package 320 are electrically and communicatively coupled to the integrated circuit die 119 through, for example, the wire bonds and substrate in the package 320, the external electrical connectors 322, the back side redistribution structure 114, through vias 116, and the front side redistribution structure 166.

Figure 27:
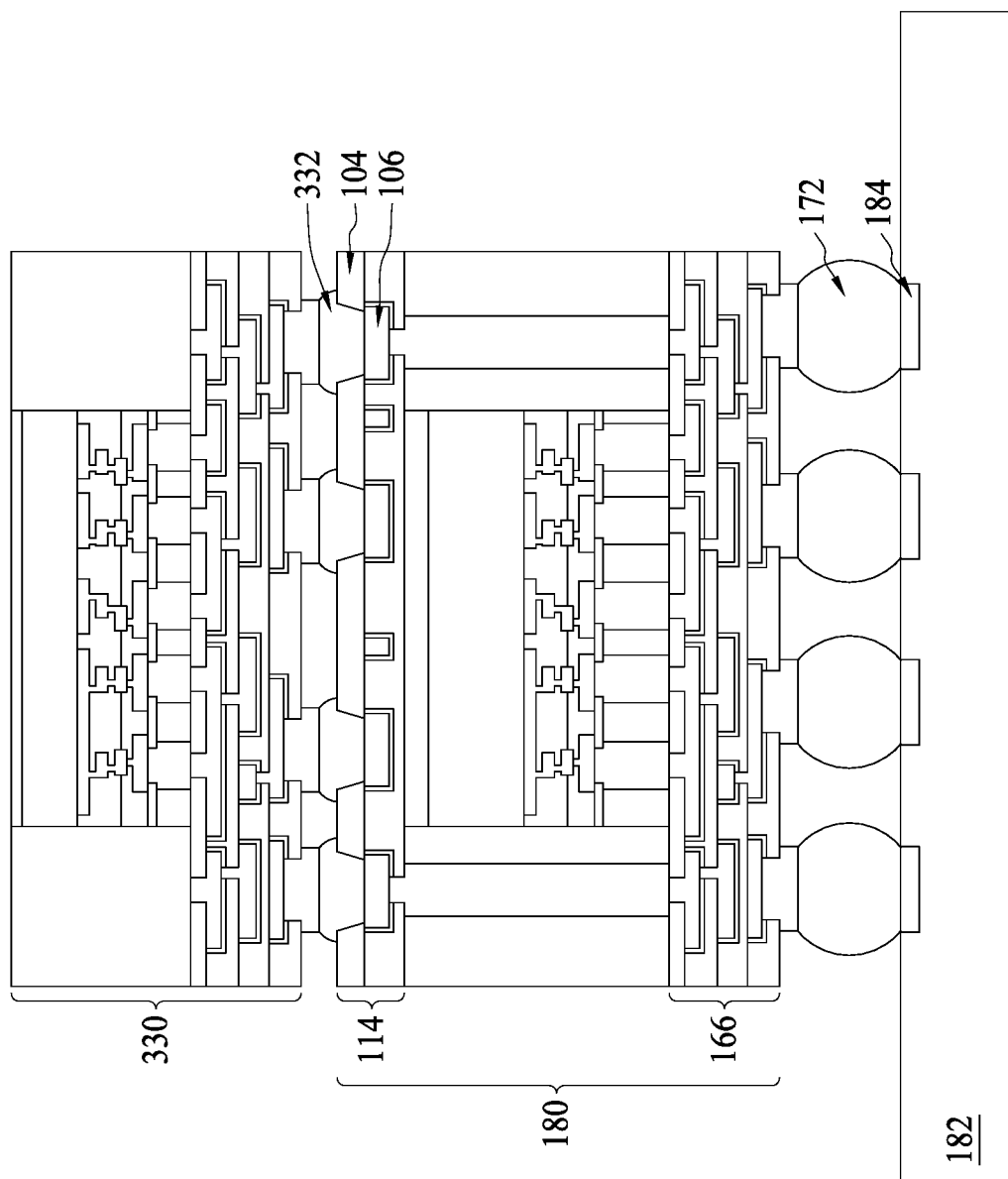
FIG. 27 is a third PoP structure in accordance with some embodiments.

In FIG. 27, a package 330 is attached to the back side redistribution structure 114 of the package 180 by external electrical connectors 332. The package 330 can be similar to the package 180 and can be formed by similar processes. For example, in comparison to the package 180, generally, the package 330 omits a back side redistribution structure and through vias. In an example, the integrated circuit die of the package 330 can be a logic die, analog die, memory die such as a dynamic random access memory (DRAM) die, or the like. The package 330 is electrically and mechanically coupled to the back side redistribution structure 114 by external electrical connectors 332 attached to the metallization pattern 106 through openings through the dielectric layer 104. In some embodiments, the external electrical connectors 332 can include low-temperature reflowable material, such as solder, such as a lead-free solder, and in additional embodiments, the external electrical connectors 332 can include metal pillars. In some embodiments, the external electrical connectors 332 are C4 bumps, microbumps, or the like. In some embodiments, the external electrical connectors 332 can be reflowed to attach the package 330 to the metallization pattern 106. The integrated circuit die of the package 330 are electrically and communicatively coupled to the integrated circuit die 119 through, for example, the a front side redistribution structure of the package 330, the external electrical connectors 332, the back side redistribution structure 114, through vias 116, and the front side redistribution structure 166.

Embodiments may achieve some advantages. For example, by providing a metal oxide layered structure on a metallization pattern and between the metallization pattern and a dielectric layer, such as a photo-sensitive dielectric material, adhesion may be improved. This improved adhesion may reduce a risk of delamination between the metallization pattern and the dielectric layer.

An embodiment is a structure. The structure includes an integrated circuit die at least laterally encapsulated by an encapsulant, and a redistribution structure on the integrated circuit die and encapsulant. The redistribution structure is electrically coupled to the integrated circuit die. The redistribution structure includes a first dielectric layer on at least the encapsulant, a metallization pattern on the first dielectric layer, a metal oxide layered structure on the metallization pattern, and a second dielectric layer on the first dielectric layer and the metallization pattern. The metal oxide layered structure includes a metal oxide layer having a ratio of metal atoms to oxygen atoms that is substantially 1:1, and a thickness of the metal oxide layered structure is at least 50 Å. The second dielectric layer is a photo-sensitive material. The metal oxide layered structure is disposed between the metallization pattern and the second dielectric layer.

Another embodiment is a structure. The structure comprises an integrated circuit die, an encapsulant at least laterally encapsulating the integrated circuit die, a first dielectric layer on the encapsulant and an active side of the integrated circuit die, a metallization pattern on the first dielectric layer, an adhesion layer on the metallization pattern, and a second dielectric layer on the first dielectric layer and the adhesion layer. The metallization pattern is electrically coupled to the active side of the integrated circuit die. The adhesion layer comprises a metal oxide layer having a ratio of metal atoms to oxygen atoms that is substantially 1:1, and a thickness of the adhesion layer is at least 50 Å. The second dielectric layer is a photo-sensitive material.

A further embodiment is a method. The method comprises encapsulating an integrated circuit die with an encapsulant; forming a dielectric layer over the encapsulant and the integrated circuit die; forming a metallization pattern over the dielectric layer; treating the metallization pattern with an oxygen-containing plasma, the treating forming a metal oxide layer having a ratio of metal atoms to oxygen atoms that is substantially 1:1 over the metallization pattern, a thickness of the metal oxide layer being at least 50 Å; and forming a photo-sensitive material over the metal oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a dielectric layer over a semiconductor die encapsulated in an encapsulant;
   depositing a conductive material over the dielectric layer;
   forming a first native oxide on the conductive material;
   exposing the first native oxide to an oxygen-containing plasma to form a metal oxide layer with a metal to oxygen ratio that is substantially 1:1, the metal oxide layer being at least 50 Å thick; and
   depositing a dielectric material over the metal oxide layer.

2. The method of claim 1, wherein the metal to oxygen ratio is between 0.9:1 and 1.1:1.

3. The method of claim 1, further comprising forming a second native oxide on the metal oxide layer.

4. The method of claim 3, wherein the first native oxide comprises cuprous oxide, the metal oxide layer comprises cupric oxide, and the second native oxide comprises cuprous oxide.

5. The method of claim 1, wherein the dielectric material comprises a photo-sensitive material.

6. The method of claim 1, wherein the metal oxide layer is less than 200 Å.

7. The method of claim 6, wherein the metal oxide layer is less than 100 Å.

8. The method of claim 1, wherein the oxygen-containing plasma further comprises nitrogen, hydrogen, or argon.

* * * * *